United States Patent
Yanagisawa et al.

(10) Patent No.: US 6,943,047 B2
(45) Date of Patent: Sep. 13, 2005

(54) DEVICE TRANSFERRING METHOD, DEVICE ARRAYING METHOD, AND IMAGE DISPLAY FABRICATION METHOD USING THE SAME

(75) Inventors: Yoshiyuki Yanagisawa, Kanagawa (JP); Toshiaki Iwafuchi, Kanagawa (JP); Masaru Minami, Kanagawa (JP); Kunihiko Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 294 days.

(21) Appl. No.: 10/209,146

(22) Filed: Jul. 31, 2002

(65) Prior Publication Data

US 2003/0034120 A1 Feb. 20, 2003

(30) Foreign Application Priority Data

Aug. 1, 2001 (JP) ..................................... P2001-234264

(51) Int. Cl.⁷ ............................................... H01L 21/44
(52) U.S. Cl. ........................... 438/22; 438/33; 438/113; 438/458; 438/464
(58) Field of Search ..................... 438/22–98, 106–127, 438/455–465; 156/238, 241

(56) References Cited

U.S. PATENT DOCUMENTS

| | | | |
|---|---|---|---|
| 5,206,749 A | 4/1993 | Zavracky et al. ............. | 349/45 |
| 5,258,320 A | 11/1993 | Zavracky et al. ............. | 438/27 |
| 5,438,241 A | 8/1995 | Zavracky et al. ......... | 315/169.3 |
| 5,827,751 A * | 10/1998 | Nuyen ......................... | 438/28 |
| 5,916,735 A * | 6/1999 | Nakashima et al. ........ | 430/314 |
| 6,027,958 A * | 2/2000 | Vu et al. ..................... | 438/110 |
| 6,215,194 B1 * | 4/2001 | Nakabayashi ............... | 257/782 |
| 6,287,891 B1 * | 9/2001 | Sayyah ........................ | 438/106 |
| 6,291,126 B2 * | 9/2001 | Wolk et al. .................. | 430/200 |
| 6,420,242 B1 * | 7/2002 | Cheung et al. ............. | 438/458 |
| 6,656,819 B1 * | 12/2003 | Sugino et al. .............. | 438/460 |
| 6,670,206 B2 * | 12/2003 | Kim et al. ..................... | 438/26 |
| 6,683,416 B1 * | 1/2004 | Oohata et al. ........... | 315/169.3 |
| 6,794,221 B2 * | 9/2004 | Sayyah ........................ | 438/107 |
| 6,818,530 B2 * | 11/2004 | Shimoda et al. ............ | 438/455 |
| 2002/0096994 A1 * | 7/2002 | Iwafuchi et al. ............ | 313/495 |
| 2002/0153832 A1 * | 10/2002 | Yanagisawa et al. ....... | 313/505 |
| 2003/0087476 A1 * | 5/2003 | Oohata et al. .............. | 438/108 |
| 2003/0134487 A1 * | 7/2003 | Breen et al. ................ | 438/455 |

FOREIGN PATENT DOCUMENTS

| | | |
|---|---|---|
| EP | 0 905 673 A1 | 3/1999 |
| JP | 50-013878 | 2/1975 |
| JP | 51-024534 | 2/1976 |
| JP | 56-17385 | 2/1981 |
| JP | 56-061468 | 5/1981 |
| JP | 56-061469 | 5/1981 |
| JP | 60-181778 | 9/1985 |

(Continued)

OTHER PUBLICATIONS

Applied Physics Letters, vol. 76, No. 22, May 29, 2000, Selective growth at InGaN quantum dot structures and their microphotoluminescence at room temperature, Tachibani et al., pp. 3212–3214.

*Primary Examiner*—Savitri Mulpuri
(74) *Attorney, Agent, or Firm*—Bell, Boyd & Lloyd LLC

(57) ABSTRACT

A device transferring method and a device arraying method are provided for readily transferring a number of devices from a first substrate to a second substrate such that the devices are enlargedly spaced from each other with a pitch larger than an array pitch of the devices arrayed on the first substrate.

2 Claims, 18 Drawing Sheets

FOREIGN PATENT DOCUMENTS

| | | |
|---|---|---|
| JP | 60-253681 | 12/1985 |
| JP | 02-114196 | 4/1990 |
| JP | 02-189803 | 7/1990 |
| JP | 04-010671 | 1/1992 |
| JP | 04-247486 | 9/1992 |
| JP | 05-290669 | 11/1993 |
| JP | 05-315643 | 11/1993 |
| JP | 07-263754 | 10/1995 |
| JP | 08-107293 | 4/1996 |
| JP | 09-120934 | 5/1997 |
| JP | 09-293904 | 11/1997 |
| JP | 10-070151 | 3/1998 |
| JP | 10-163536 | 6/1998 |
| JP | 10-173305 | 6/1998 |
| JP | 10-256694 | 9/1998 |
| JP | 10-305620 | 11/1998 |
| JP | 11-8338 | 1/1999 |
| JP | 11-126037 | 5/1999 |
| JP | 11-142878 | 5/1999 |
| JP | 11-219146 | 8/1999 |
| JP | 2000-89693 | 3/2000 |
| JP | 2000-169808 | 6/2000 |
| JP | 2000-248240 | 9/2000 |
| WO | WO 95/05623 | 2/1995 |

* cited by examiner

F I G. 1 A
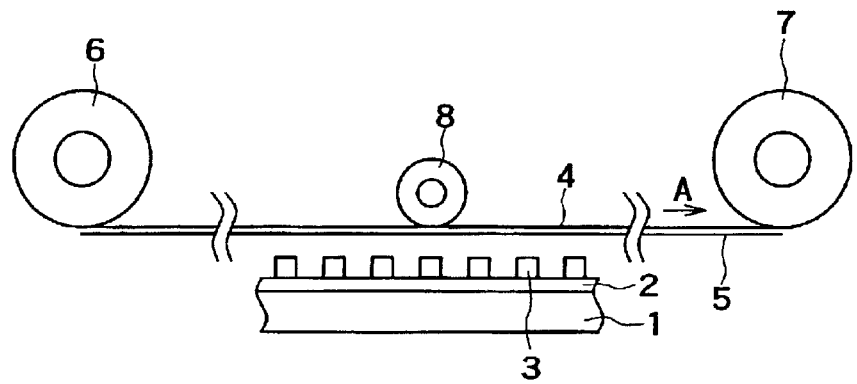
F I G. 1 B
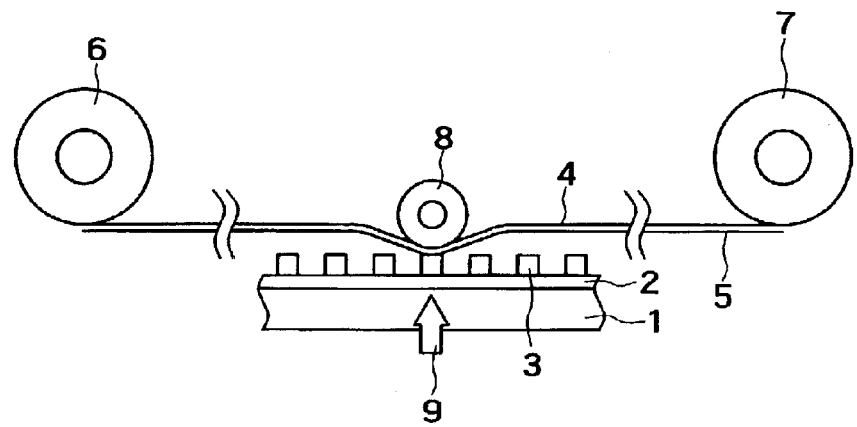
F I G. 1 C
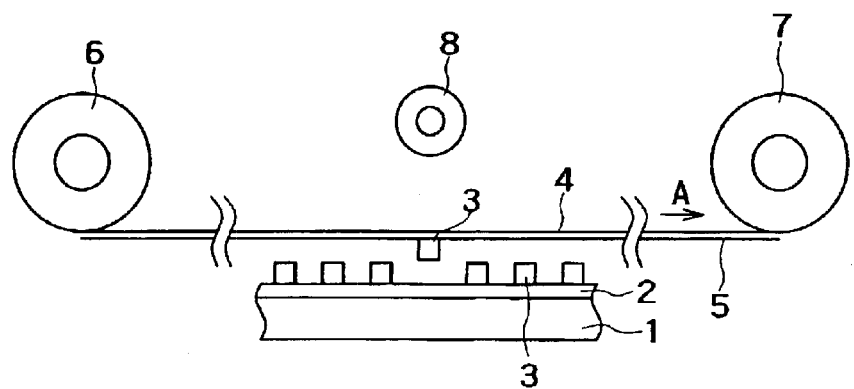

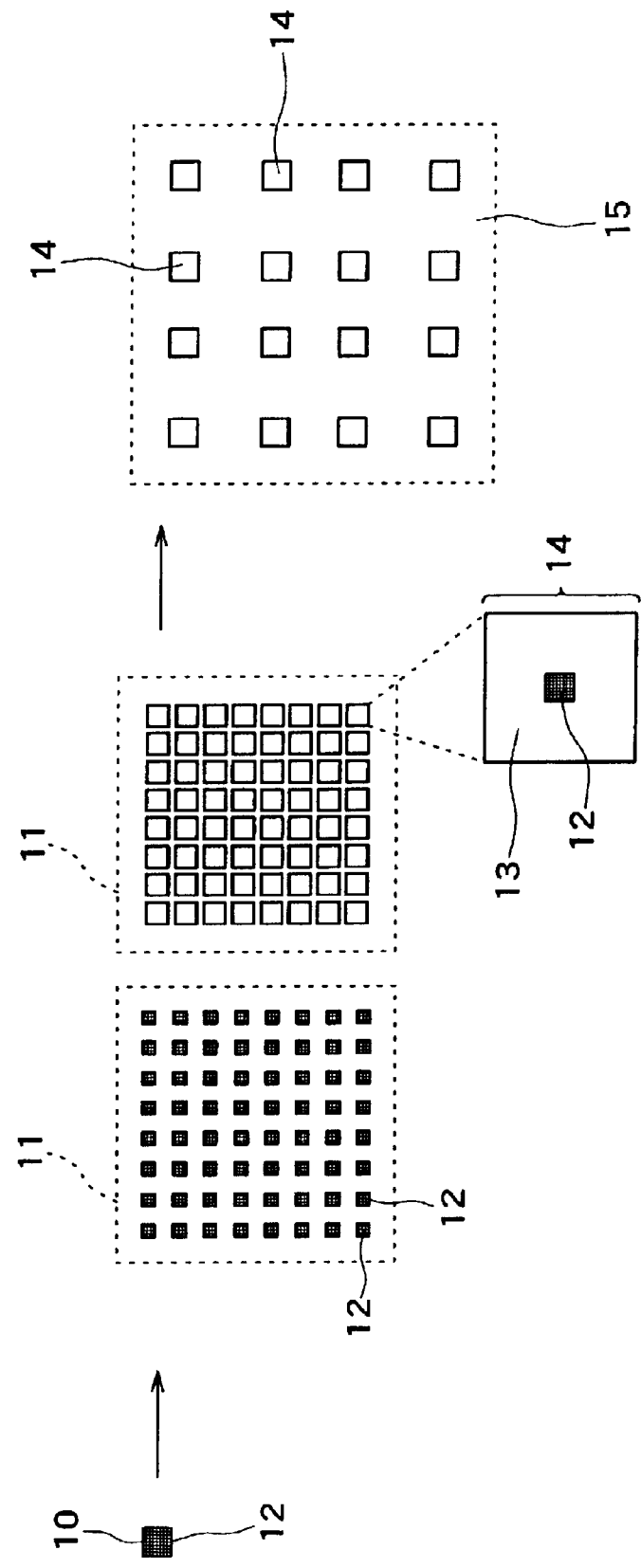

US 6,943,047 B2

DEVICE TRANSFERRING METHOD, DEVICE ARRAYING METHOD, AND IMAGE DISPLAY FABRICATION METHOD USING THE SAME

BACKGROUND OF THE INVENTION

The present invention relates to a device transferring method of transferring devices such as semiconductor light emitting devices, a device arraying method of re-arraying devices, each having a fine structure, densely arrayed such that the devices are enlargedly spaced from each other by making use of the device transferring method, and an image display unit fabrication method making use of the device arraying method.

Methods of transferring or arraying devices are known. One of these methods involves dicing a wafer to isolate devices from each other, transferring the isolated devices from a dicing sheet to a chip tray, and picking up the devices (for example, semiconductor chips) from the chip tray by vacuum attraction to mount or connect the devices to a substrate. This method is generally carried out during a process of fabricating semiconductor packages. This method, however, requires the step of transferring and mounting the devices one by one, and is not appropriate for arraying a large number of devices.

To array a number of devices, there are known methods of directly mounting devices, each having a fine structure, on a substrate, as disclosed in Japanese Patent Laid-open No. Hei 9-120934. According to this method, recesses corresponding to an array pattern of devices are previously formed in the substrate, and a slurry in which devices are dispersed in a liquid are made to flow on the substrate so as to be put in the recesses formed in the substrate, whereby the devices are arrayed on the substrate. Such a method, however, has disadvantages in that a number of devices larger than that of the recesses must be prepared and it takes a long time for the devices to be put in the recesses, thereby requiring a long time until the device arraying step is completed. Further, the recesses must be formed at a high accuracy when arraying the devices on a large substrate and a large-sized apparatus capable of containing a substrate is required to form the recesses in the substrate. These disadvantages are amplified when smoothly arraying devices on a substrate.

For example, when arraying light emitting devices in a matrix to fabricate an image display unit, a technique to efficiently transfer and array a large number of devices while carrying a distance for each of the devices is essential. Accordingly, a need exists for an improved device transferring method and an improved device arraying method.

SUMMARY OF THE INVENTION

A first advantage of the present invention is, therefore, to provide a device transferring method capable of readily transferring a number of devices such that the devices are enlargedly spaced from each other.

A second advantage of the present invention is to provide a device arraying method capable of readily re-arraying a number of devices such that the devices are enlargedly spaced from each other.

A third advantage of the present invention is to provide an image display unit fabrication method capable of simply fabricating an image display unit including light emitting devices arrayed in a matrix by using a device transferring method and a device arraying method according to the present invention.

According to an embodiment of the present invention, a device transferring method is provided. The method includes the step of selectively transferring part of a number of devices formed in an array on a first substrate to a flexible second substrate including an adhesive layer.

With this configuration, the devices formed in an array on the first substrate are transferred to the flexible second substrate including the adhesive layer, and accordingly, upon transfer of the devices, the flexible second substrate can be flexed along the shape of each of the devices, so that the transfer of the devices can be performed in the state that the second substrate is certainly in contact with the devices. As a result, the devices can be efficiently transferred with a high yield and a high reliability.

According to another embodiment of the present invention, a device arraying method of re-arraying a number of devices arrayed on a first substrate to a second substrate is provided. The method includes a first transfer step of transferring and holding the devices to and on a first temporarily holding member such that the devices are spaced from each other with a pitch larger than an array pitch of the devices arrayed on the first substrate. Further, the method includes a resin-covering step of covering the devices held on the first temporarily holding member with a resin, and curing the resin, a dicing step of dicing the resin to isolate the devices from each other, and a second transfer step of transferring the resin-covered devices held on the first temporarily holding member to the second substrate such that the resin-covered devices are spaced from each other with a pitch larger than an array pitch of the resin-covered devices held on the first temporarily holding member. In this method, the second transfer step further includes the steps of selectively transferring part of the number of resin-covered devices held on the first temporarily holding member to a flexible third substrate including an adhesive layer, and transferring the part of the resin-covered devices, which have been transferred to the third substrate, to the second substrate including another adhesive layer.

With this configuration, since the transfer of the devices can be efficiently, certainly performed by using a transfer method according to the present invention, the enlarge transfer for transferring the devices with a distance for each of the devices enlarged can be smoothly performed.

According to yet another embodiment of the present invention, an image display unit fabrication method of fabricating an image display unit including light emitting devices arrayed in a matrix is provided. The method includes a first transfer step of transferring and holding the light emitting devices to and on a first temporarily holding member such that the light emitting devices are spaced from each other with a pitch larger than an array pitch of the light emitting devices arrayed on the first substrate. Further, the method includes a resin-covering step of covering the light emitting devices held on the temporarily holding member with a resin and curing the resin, a dicing step of dicing the resin to isolate the resin-covered light emitting devices from each other, and a second transfer step of transferring the resin-covered light emitting devices held on the first temporarily holding member to a second substrate such that the resin-covered light emitting devices are spaced from each other with a pitch larger than an array pitch of the resin-covered light emitting devices held on the first temporarily holding member. In this method, the second transfer step further includes the steps of selectively transferring part of the number of resin-covered light emitting devices held on the first temporarily holding member to a flexible third substrate including an adhesive layer, and transferring the part of the resin-covered light emitting devices, which have been transferred to the third substrate, to the second substrate including another adhesive layer.

With this configuration, an image display unit portion is produced from the light emitting devices arrayed in a matrix according to the above-described device transferring method and device arraying method of the present invention. As a result, the devices, each having a fine structure, formed densely (i.e., at a high degree of integration) can be efficiently re-arrayed such as to be enlargedly spaced from each other, thereby significantly improving the productivity.

Additional features and advantages of the present invention are described in, and will be apparent from, the following Detailed Description of the Invention and the Figures.

BRIEF DESCRIPTION OF THE FIGURES

FIGS. 1A to 1C are schematic sectional views showing steps of a transfer process according to a device transferring method of an embodiment of the present invention.

FIGS. 7A to 7D are typical views showing a device arraying method according to an embodiment of the present invention.

DETAILED DESCRIPTION OF THE INVENTION

Figure 2A:
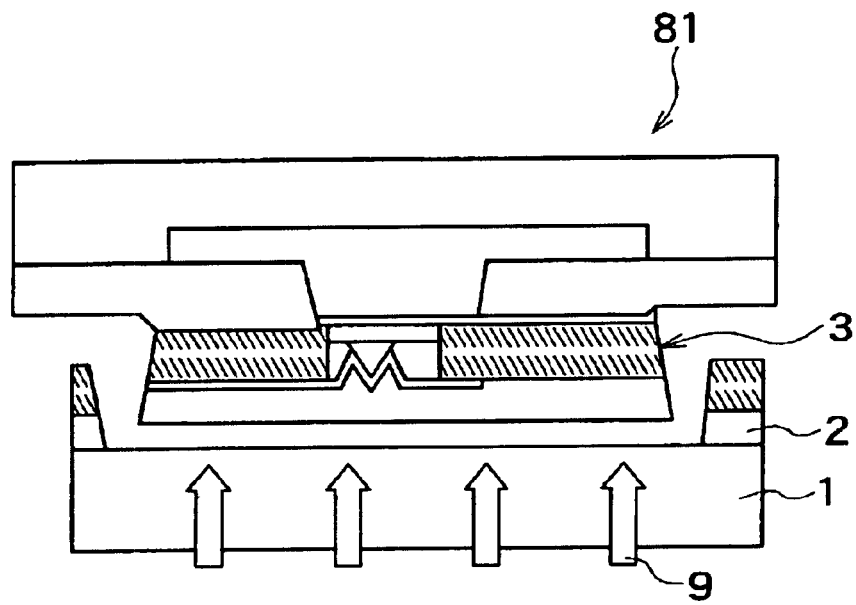
FIGS. 2A and 2B are schematic sectional views showing a comparative example using a vacuum attracting head for comparison with a transfer process according to a device transferring method of an embodiment of the present invention.

A device transferring method according the present invention, will be first described by way of an embodiment shown in FIGS. 1A to FIG. 1C. In this embodiment, the device transferring method of the present invention is applied to transfer devices formed on a base substrate to a flexible substrate.

First, as shown in FIG. 1A, an adhesive layer 2 is formed on a base substrate 1 as a supply source, and a number of devices 3 are formed in an array on the base substrate 1.

The base substrate 1 is not particularly limited but may be made from any suitable material in consideration of a combination with the devices 3, and the like.

The adhesive layer 2 may be configured as an adhesive layer allowing the devices 3 to be adhesively fixed thereto at the time of forming the devices 3 in an array on the base substrate 1 and to be later peeled therefrom at the time of picking up the devices 3 from the base substrate 1. By forming the adhesive layer 2 on the base substrate 1 and then forming the devices 3 in an array on the base substrate 1 via the adhesive layer 2, the devices 3 can be simply picked up from the base substrate 1.

The adhesive layer 2 is preferably made from a thermoplastic material, and particularly, the adhesive layer 2 is preferably formed as a sheet made from a thermoplastic resin or a thermal peelable material.

When using a thermoplastic resin as the material of the adhesive layer 2, when the adhesive layer 2 is heated, the thermoplastic resin is plasticized, which weakens an adhesive force between the adhesive layer 2 and the devices 3, thereby allowing the devices 3 to be easily peeled from the adhesive layer 2.

The thermal peelable material is a material that is foamed or expanded when being heated, so that an adhesive force thereof is reduced, to allow an object adhering to the thermal peelable material to be simply peeled therefrom. The thermal peelable material contains a foaming or expanding agent, wherein the foaming or expanding agent is foamed or expanded when the material is heated, with a result that the adhesively-bonded area of an object to the thermal peelable material is reduced, thereby relinquishing the adhesive force against the object.

As the thermal peelable material, there can be used a known thermal peelable type pressure-sensitive adhesive sheet, examples of which include a heating peelable type pressure-sensitive adhesive sheet as disclosed in Japanese Patent Publication Nos. Sho 50-13878 and Sho 51-24534, and Japanese Patent Laid-open Nos. Sho 56-61468, Sho 56-61469, and Sho 60-253681, wherein a pressure-sensitive adhesive layer containing a foaming agent is provided on a base material; a heating peelable type pressure-sensitive adhesive sheet as disclosed in Japanese Patent Laid-open No. 2000-248240, wherein a non-thermal expandable pressure-sensitive adhesive layer is provided on at least one side of a thermal expandable layer containing thermal expandable micro-balls and expandable by heating; and a thermal peelable type pressure-sensitive sheet as disclosed in Japanese Patent Laid-open No. 2000-169808, wherein a thermal expandable layer containing thermal expandable micro-balls and a pressure-sensitive adhesive layer containing a pressure-sensitive adhesive material are provided on at least one side of a base material having a heat-resistance and a flexibility.

As an alternative, the adhesive layer 2 may be configured such that a peelable layer is formed on the base substrate 1 and a pressure-sensitive adhesive layer is formed on the peelable layer. The peelable layer may be formed as a fluorine coat, or a coat made from a silicon resin, a water-soluble adhesive (for example, PVA), polyimide, or the like. The pressure-sensitive adhesive layer may be made from a UV pressure-sensitive adhesive whose adhesive force is reduced by irradiation of ultraviolet rays. When using the adhesive layer 2 having such a configuration, the interface between the adhesive layer 2 and the base substrate 1 is irradiated with excimer laser beams traveling from the back side of the base substrate 1, so that if the base substrate 1 is made from quartz and the adhesive layer 2 is made from polyimide, peeling occurs at the interface between polyimide and quartz by abrasion of polyimide, with a result that the devices 3 can be peeled from the base substrate 1.

It is to be noted that the adhesive layer 2 is not limited to that described above, but may be configured as any other suitable adhesive layer insofar as the adhesive layer allows, as described above, the devices 3 to be adhesively fixed thereto at the later time of forming the devices 3 in array on the base substrate 1 and to be peeled therefrom at the time of picking up the devices 3 from the base substrate 1. Accordingly, the adhesive layer 2 may be a pressure-sensitive adhesive layer having a weak adhesive force only necessary for holding the devices 3 on the base substrate 1. In alternative embodiments, the adhesive layer 2 may be omitted, that is, it may be replaced with any other member capable of fixing the devices 3.

It is to be noted that the following description will be made by way of an embodiment using the adhesive layer 2 made from a thermoplastic resin.

The device 3 is not particularly limited but may be configured as any suitable device, for example, a light emitting device, a liquid crystal control device, a photoelectric conversion device, a piezoelectric device, a thin film transistor device, a thin film diode device, a resistance device, a switching device, a micro-magnetic device, or a micro-optical device. In addition, the device 3 used for the present invention may be an electronic part in the form of a chip formed by burying the above-described device in plastic. Such a chip is called an LIP ("LED in Plastic). In this way, the present invention can be extensively applied not only to the above-described devices but also to an electronic part in the form of a chip (LIP). It is to be noted that the following description will be made by way of an embodiment using LIPs as the devices 3.

As shown in FIG. 1A, a flexible substrate 4 is located over the base substrate 1 such as to keep a desired positional relationship therewith. A second adhesive layer 5 is formed on a principal plane, on which the devices 3 are to be transferred, of the flexible substrate 4. In other words, the flexible substrate 4 is disposed over the base substrate 1 with the second adhesive layer 5 opposed to the base substrate 1.

The flexible substrate 4 may be configured as any substrate selected in consideration of a combination with the devices 3, the intended use thereof, and the like. However, according to an embodiment of the present invention, the flexible substrate 4 is configured as a flexible substrate having the second adhesive layer 5 on its principal plane. The material of the flexible substrate 4 is not particularly limited insofar as it has a suitable flexibility and a suitable strength, but may be suitably selected in consideration of the intended use thereof. In general, polyimide or polyethylene terepthalate is preferably used as the material of the flexible substrate 4. If a heating treatment is required for peeling the devices 3 from the base substrate 1 (as will be described later), a material having a sufficient heat-resistance against the heating treatment may be used for the flexible substrate 4, and if UV-irradiation is required for peeling the devices 3 from the base substrate 1, a light permeable material may be used for the flexible substrate 4.

The shape of the flexible substrate 4 is not particularly limited but may be suitably selected in consideration of the intended use thereof, for example, a film shape or a tape shape. For example, when carrying out enlarged transfer of the devices 3, the use of the flexible substrate 4 formed into a film shape is preferable because enlarged transfer in the longitudinal direction and enlarged transfer in the lateral direction can be made in one step. It is to be noted that the following description will be made by way of an embodiment using the film-shaped flexible substrate 4.

The second adhesive layer 5 is not particularly limited insofar as it can adhesively bond the devices 3 to the flexible substrate 4 but may be suitably selected in consideration of various conditions, for example, the kinds of the devices 3. For example, the second adhesive layer 5 may be made from a material that exhibits a pressure-sensitive force when being heated, to adhesively bond the devices 3 to the flexible substrate 4. Such a material is exemplified by a thermoplastic material or a solder. The second adhesive layer 5 may be formed overall on the transfer plane of the flexible substrate 4 or formed only at positions, corresponding to those of the devices 3, of the flexible substrate 4.

The flexible substrate 4 is wound around an unwinding roll 6 with the second adhesive layer 5 directed outwardly. At the time of transfer of the devices 3, the flexible substrate 4 is unwound from the unwinding roll 6 in a direction shown by an arrow A in FIG. 1A. After the transfer of the devices 3, the unwound portion of the flexible substrate 4 separated from the base substrate 1 side by a specific distance are wound around a winding roll 7 driven in linkage with the unwinding roll 6.

Since the flexible substrate 4 which is wound around the unwinding roll 6 is unwound therefrom at the time of transfer of the devices 3 and is wound around the winding roll 7 after the transfer of the devices 3, the movement control of the flexible substrate 4 can be simply performed and the transfer of the devices 3 can be performed without the need for a wide space for transfer.

The material of each of the unwinding roll 6 and the winding roll 7 is not particularly limited but may be arbitrarily selected insofar as the material does not damage the flexible substrate 4 and does not react with the flexible substrate 4 when it comes in contact with the flexible substrate 4.

As shown in FIG. 1A, a pressing roll 8 is disposed at a specific position over the base substrate 1 and the flexible substrate 4. The pressing roll 8 is provided for pressing the flexible substrate 4 to the upper surfaces of the devices 3 selected from those arrayed on the base substrate 1. The material of the pressing roll 8 is not particularly limited but may be arbitrarily selected insofar as the material does not damage the flexible substrate 4 and does not react with the flexible substrate 4 when it comes in contact with the flexible substrate 4.

As shown in FIG. 1B, at the time of transfer of the devices 3, the pressing roll 8 is moved down to the flexible substrate 4 located opposite to the base substrate 1, and is brought into contact with the upper surface, that is, the principal plane on the side reversed to the side on which the second adhesive layer 5 is formed, of the flexible substrate 4, and then the pressing roll 8 is further moved down so as to bring the second adhesive layer 5 side of the flexible substrate 4 into contact with the upper surface of the device 3 to be transferred. It is to be noted that although only one device 3 to be transferred is shown in FIG. 1B, a number of the devices 3 can be transferred at once.

When the second adhesive layer 5 of the flexible substrate 4 is brought into contact with the target device 3, the downward movement of the pressing roll 8 is stopped, and a specific pressure is applied from the pressing roll 8 to the flexible substrate 4 for a specific time. At the same time, a portion, located at a position corresponding to that of the target device 3 is irradiated with an excimer laser beam 9 traveling from the back side, reversed to the side on which the first adhesive layer 2 is formed, of the base substrate 1, to heat and plasticize the portion, corresponding to the target device 3, of the first adhesive layer 2, thereby reducing an adhesive force of the plasticized portion of the first adhesive layer 2 to the target device 3. As a result, the target device 3 can be peeled from the base substrate 1. To be more specific, in the state that the target device 3 is peelable from the base substrate 1, the upper surface of the target device 3 is pressed by the flexible substrate 4. At this time, since the target device 3 is in contact with the flexible substrate 4 via the second adhesive layer 5 formed on the transfer plane of the flexible substrate 4, the target device 3 is fixed to the flexible substrate 4 by the adhesive force of the second adhesive layer 5. After that, by moving up the pressing roll 8, the flexible substrate 4 is separated from the base substrate 1, to complete the transfer of the target device 3 from the base substrate 1 to the flexible substrate 4.

FIG. 1C shows a state that the flexible substrate 4 is separated from the base substrate 1 by moving up the pressing roll 8, to thereby transfer the target device 3 to the flexible substrate 4.

The flexible substrate 4 is then fed by a specific distance in the direction A in FIG. 1C, and the above-described transfer step is repeated, with a result that a specific number of the devices 3 are transferred from the base substrate 1 to the flexible substrate 4 with a specific pitch.

The above-described device transferring method characterized by transferring the devices 3 formed in an array on the base substrate 1 to the flexible substrate 4 including the second adhesive layer 5 has the following advantage.

The related art device transferring method characterized by transferring devices formed in an array on a base substrate to a transfer substrate with no flexibility has the following problem. Namely, when a device adjacent to the target device is higher than that of the target device, the transfer substrate cannot be brought into contact with the target device, with a result that the target device, that is, a lower device cannot be selectively transferred from the base substrate to the transfer substrate. To transfer such lower devices, it is required to repeat the transfer step, that is, perform a first step of transferring higher devices and then perform a second step of transferring the lower devices.

In contrast, when using device transferring method according to an embodiment of the present invention, the flexible substrate 4 can be brought into press-contact with only the target devices 3 by making use of the flexibility of the flexible substrate 4, to transfer only the target devices 3 to the flexible substrate 4. At this time, since the flexible substrate 4 is flexed along the shape of each of the target devices 3 and is brought into press-contact therewith, the flexible substrate 4 can be certainly brought into press-contact with the target devices 3.

As a result, according to an embodiment of a device transferring method of the present invention, even if the heights of the devices 3 formed in an array on the base substrate 1 are varied, the target devices 3 can be certainly and simply transferred to the flexible substrate 4 irrespective of the variation in height of the devices 3. To be more specific, even if a device adjacent to the target device is higher than that of the target device, the target device can be selectively transferred to the flexible substrate. Accordingly, it is not required to repeat the transfer step for transferring the target device, and it is possible to eliminate occurrence of a failure of a transfer substrate caused by the fact that the desired devices cannot be transferred thereto. A device transferring method according to an embodiment of the present invention is thus advantageous in that devices can be efficiently transferred with a high yield and a high reliability.

Even when the heights of the devices 3 formed in an array on the base substrate 1 are equalized, if the base substrate 1 is not flattened, there occurs a variation in height of the devices 3. Even in this case, according to an embodiment of a method of the present invention, it is possible to certainly and simply transfer the target devices 3 to the flexible substrate 4 irrespective of the variation in height of the devices 3 as described above.

Even if the devices 3 are formed in an array on the base substrate 1 such as to be tilted from the base substrate 1, since the flexible substrate 4 is flexed along the shape of each of the target devices 3 by making use of the flexibility thereof and is brought into press-contact therewith, the flexible substrate 4 can be certainly brought into press-contact with the target devices 3. As a result, even the target devices 3 tilted from the base substrate 1 can be transferred from the base substrate 1 to the flexible substrate 4 with a high reliability.

Figure 2B:
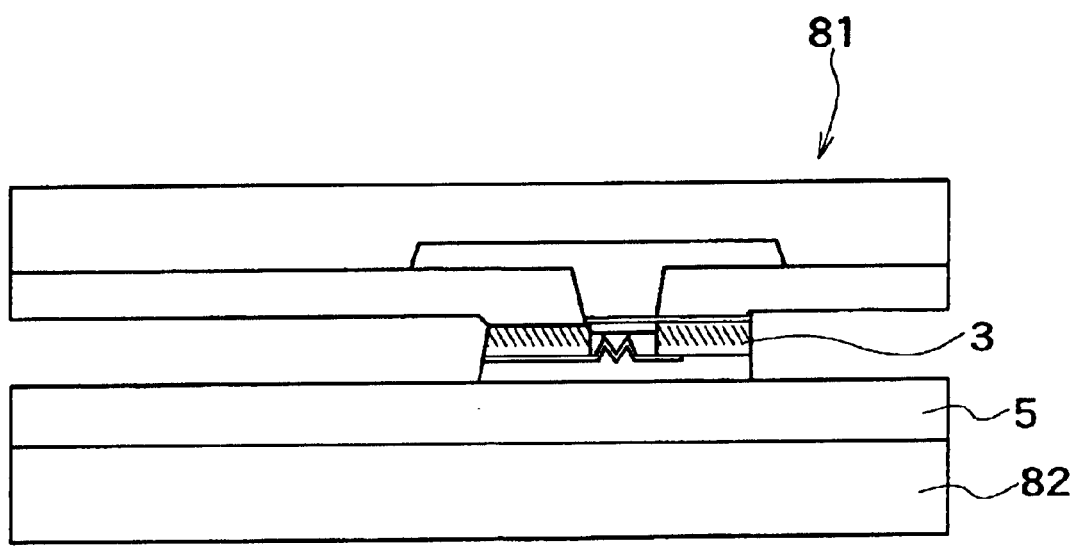

Another problem of the related art transfer method caused by the tilting of a transfer plane of a target device will be described below. FIGS. 2A and 2B show a state that a device 3 (in the form an LIP) is transferred by a vacuum attracting head 81. In this transfer, as shown in FIG. 2A, the device 3 is irradiated with a laser beam 9 from the back side of a base substrate 1 to reduce an adhesive force of a first adhesive layer 2 to the device 3, thereby making the device 3 peelable from the first adhesive layer 2, and in such a state, the device 3 is picked up from the base substrate 1 by the vacuum attracting head 81. As shown in FIG. 2B, the device 3 held by the vacuum attracting head 81 is mounted to a transfer substrate 82 via a second adhesive layer 5. In this transfer, if the flatness of the vacuum attracting head 81, that is, the flatness of the attraction plane of the device 3 is not desirable, since the vacuum attracting head 81 is not desirably brought into contact with the device 3, the device 3 fails to be certainly and stably held by the vacuum attracting head 81. As a result, there may occur an inconvenience that the device 3 is dropped from the vacuum attracting head 81 before completion of the transfer or the device 3 is obliquely mounted to the transfer substrate 82, thereby lowering the yield and degrading the quality. The same problem may occur where the devices 3 are formed in an array on the base substrate 1 such as to be tilted from the base substrate 1.

In contrast, according to an embodiment of a device transferring method of the present invention, as described above, since the transfer substrate, that is, the flexible substrate 4 has flexibility, the flexible substrate 4 can be brought into press-contact with only the target device 3 by making use of the flexibility of the flexible substrate 4. This makes it possible to desirably transfer the target device 3 to the flexible substrate 4. At this time, since the flexible substrate 4 is flexed along the shape of the device 3 and is brought into press-contact with the device 3, the flexible substrate 4 can be certainly brought into press-contact with the device 3. As a result, according to an embodiment of a method of the present invention, even if the heights of the devices 3 formed in an array on the base substrate 1 are varied, the target devices 3 can be certainly and simply transferred to the flexible substrate 4 irrespective of the variation in height of the devices 3.

In summary, when using the vacuum attracting head 81, if the flatness of the vacuum attracting head 81, that is, the flatness of the attraction plane of the target device 3 is undesirable, it fails to selectively transfer the target device 3. However, according to a device transferring method of an embodiment of the present invention, it is possible to desirably transfer the target device 3 irrespective of the tilting of the transfer plane of the target device 3.

The transfer of a number of the devices 3 arrayed in a matrix will be described below.

Only the transfer state of the devices 3 arrayed in the longitudinal direction of the flexible substrate 4 is shown in the sectional views of FIGS. 1A to 1C. However, in actuality, a number of the devices 3 are arrayed not only in the longitudinal direction of the flexible substrate 4 but also in the lateral direction of the flexible substrate 4, that is, in the direction parallel to the axial direction of the pressing roll 8. According to an embodiment of the present invention, the devices 3 thus arrayed in both the longitudinal and lateral directions of the flexible substrate 4 can be selectively transferred at once by the device transferring method described above with a high efficiency. In this transfer, as described above, unless the first adhesive layer 2 formed on each of the target devices 3 arrayed in the lateral direction of the flexible substrate 4 is heated to reduce the adhesive force thereof to the device 3 for making the device 3 peelable from the base substrate 1, the target devices 3 cannot be transferred to the flexible substrate 4 even by bringing the second adhesive layer 5 of the flexible substrate 4 into contact with the target devices 3 by the pressing roll 8. In this way, according to an embodiment of the present invention, since the devices 3 arrayed not only in the longitudinal but also lateral directions of the flexible substrate 4 can be selectively transferred, it is possible to simply and efficiently perform enlarged transfer of the devices 3 both in the longitudinal and lateral directions of the flexible substrate 4.

Although description has been made by way of an embodiment using only one pressing roll 8, the number of the pressing rolls 8 is not particularly limited. In this respect, a number of the pressing rolls 8 may be disposed at specific intervals, and enlarged transfer with a specific pitch can be made by using the number of pressing rolls 8 in accordance with the same manner as that described above. In this transfer, a large number of the devices, which is increased in proportional to the number of the pressing rolls 8, can be transferred at once, and therefore, the transfer of the devices can be performed even more efficiently.

Figure 3A:
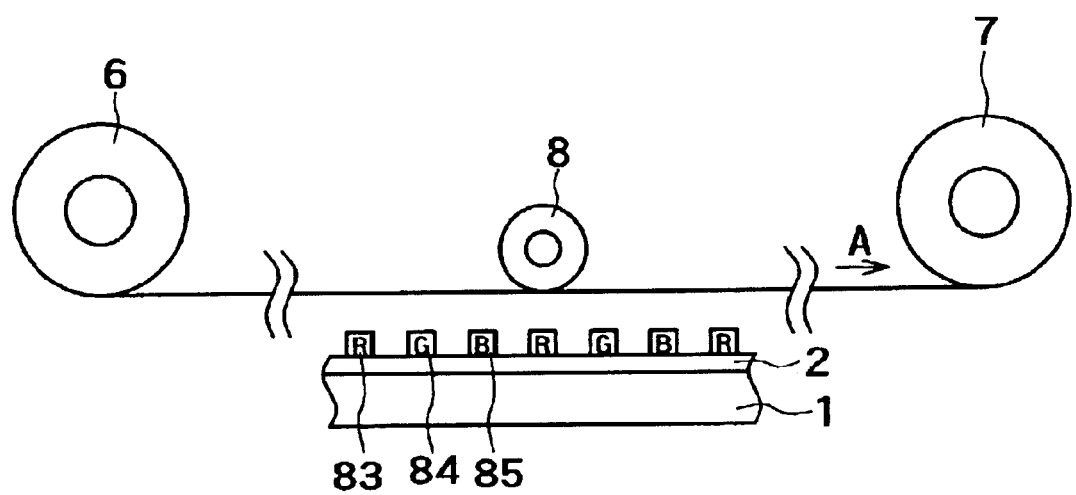
FIGS. 3A and 3B are schematic sectional views showing one example where a transfer process according to a device transferring method of an embodiment of the present invention is applied to transfer three kinds of devices for emission of light of three colors.
Figure 3B:
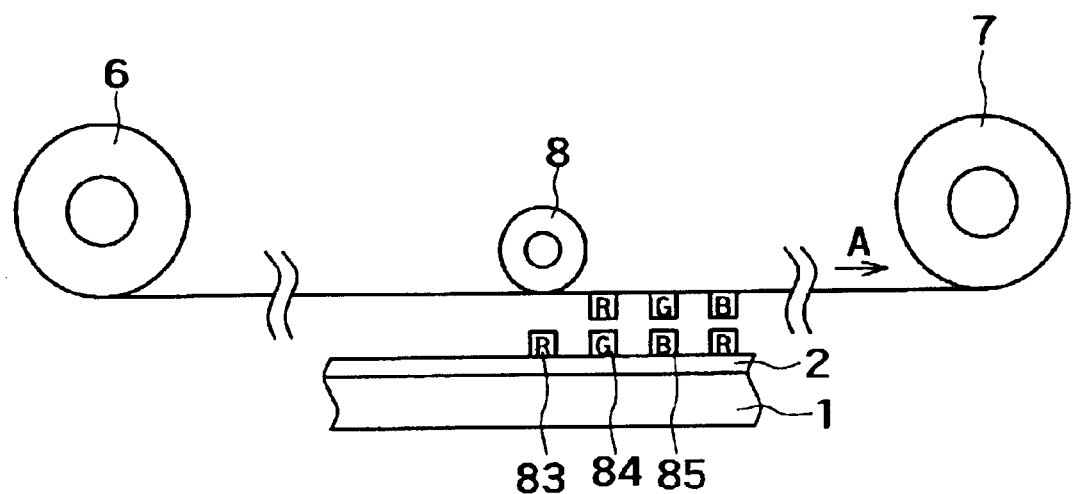

Although the transfer of one kind of the devices 3 formed in an array on the base substrate 1 to the flexible substrate 4 has been described, according to an embodiment of a method of the present invention, a number of kinds of the devices 3 formed in an array on the base substrate 1 can be transferred to the flexible substrate 4. For example, as shown in FIG. 3A, three kinds of semiconductor light emitting devices 83, 84 and 85 for emission of red light (R), green light (G), and blue light (B), respectively, are formed in an array on the base substrate 1 in this order. As shown in FIG. 3B, the three kinds (R, G, and B) of semiconductor light emitting devices 83, 84 and 85 can be selectively transferred to the flexible substrate 4 in this order in the same manner as that described above. In this case, the flexible substrate 4 is fed in the direction A in FIGS. 3B for each transfer of the three kinds of semiconductor light emitting devices 83, 84 and 85. In this way, according to an embodiment of the present invention, the three kinds (R, G, and B) of semiconductor light emitting devices 83, 84 and 85 can be transferred from one base substrate 1 to the flexible substrate 4 in one step without replacement of the base substrate 1 to another base substrate, that is, without changing the working set-up. As a result, it is possible to efficiently transfer the three kinds (R, G, and B) of semiconductor light emitting devices 83, 84, and 85 while significantly shortening the working time as compared with the transfer of the devices 83 and 84, and 85 from three kinds of base substrates having the devices 83, 84, and 85 formed in an array thereon, respectively.

Figure 4:
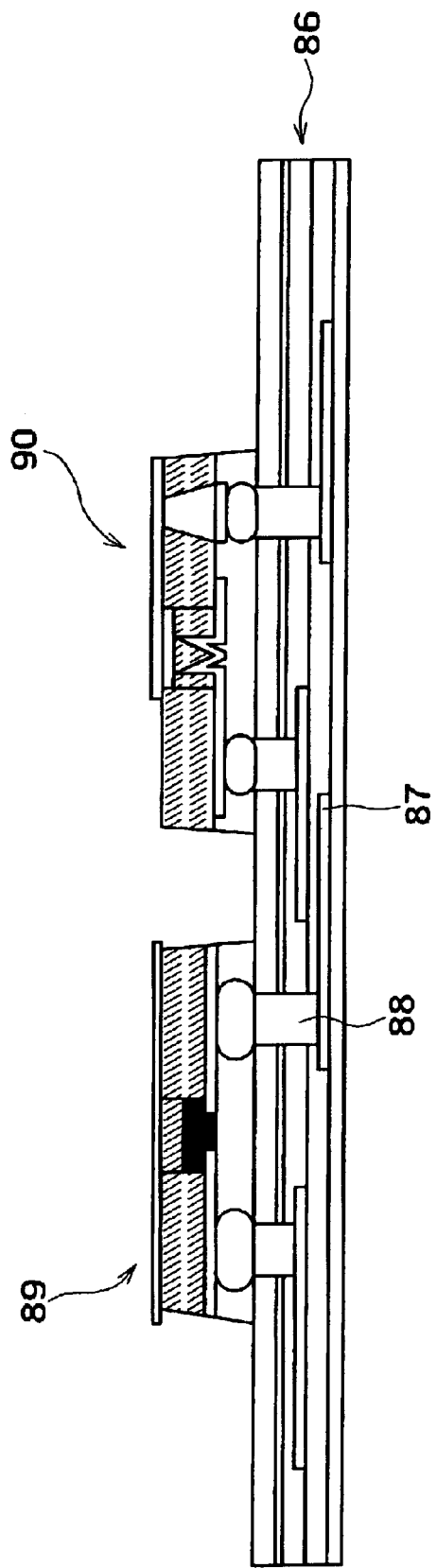
FIG. 4 is a schematic sectional view showing a resin-covered chip for emission of red light and a resin-covered chip for emission of green light which are transferred to a flexible wiring substrate by a transfer process according to a device transferring method of an embodiment of the present invention.

Wiring portions for electrical connection with electrodes of the devices 3 may be previously formed on the flexible substrate 4. For example, according to an embodiment of the present invention, a flexible wiring substrate 86 can be used as shown in FIG. 4, in which wiring portions 87 and 88 are formed on the substrate 86 in a specific pattern corresponding to positions and shapes of electrodes of the devices 3 to be transferred to the substrate 86. The use of such a flexible wiring substrate 86 makes it possible to perform electrical connection with the devices 3 simultaneously with transfer of the devices 3, and hence to omit an additional step of electrically connecting the devices 3 to the transfer substrate. This is advantageous in efficiently fabricating an image display unit using the devices 3 at a low cost. Even in this case, by forming various kinds of wiring patterns, corresponding to devices to be transferred, on the flexible wiring substrate 86, different kinds of devices, for example, as shown in FIG. 4, an LIP 89 for emission of red light (R) and an LIP 90 for emission of green light (G) can be efficiently transferred to the same substrate.

A further feature of an embodiment of the present invention is to efficiently perform enlarged transfer with a high enlargement ratio at a high yield. Specifically, the above-described flexible substrate 4 can be used in place of a holding member for transfer, for example, a vacuum attracting head. In this case, the sufficiently enlarged transfer of the devices 3 from the base substrate 1 to another substrate via the flexible substrate 4 can be realized by transferring the devices 3 to the flexible substrate 4 used as the holding member, and then transferring the devices 3 held on the flexible substrate 4 to the transfer substrate.

The enlarged transfer using the flexible substrate 4 will be described below. It is to be noted that in the following description, parts corresponding to those described above are denoted by the same reference numeral and the overlapped description thereof is omitted.

Figure 5A:
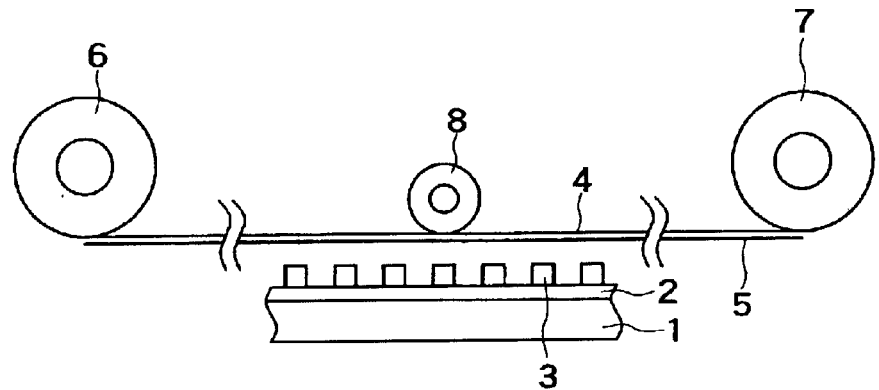
FIGS. 5A to 5C are schematic sectional views showing steps of an enlarged transfer process according to a device transferring method of an embodiment of the present invention.
Figure 5B:
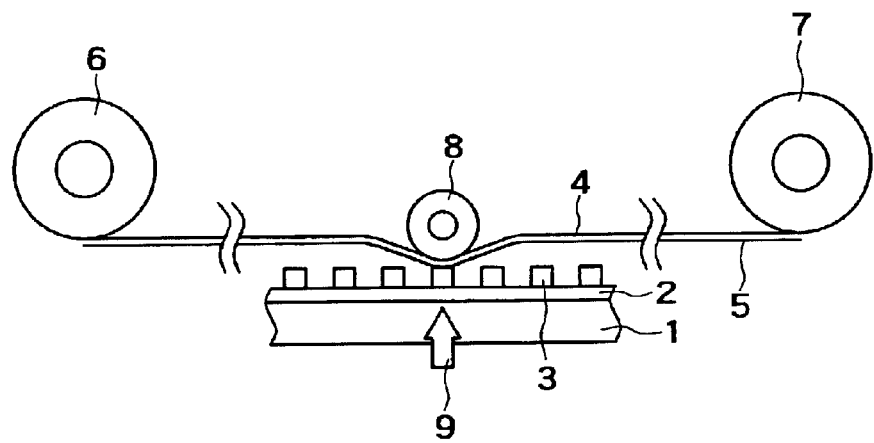

As shown in FIG. 5A, at the time of transfer of the devices 3, the pressing roll 8 is moved down to the flexible substrate 4 located opposite to the base substrate 1, and is brought into contact with the upper surface, that is, the principal plane on the side reversed to the side on which the second adhesive layer 5 is formed, of the flexible substrate 4, and then, as shown in FIG. 5B, the pressing roll 8 is further moved down so as to bring the second adhesive layer 5 side of the flexible substrate 4 into contact with the upper surface of the device 3 to be transferred.

When the second adhesive layer 5 of the flexible substrate 4 is brought into contact with the target device 3, the downward movement of the pressing roll 8 is stopped, and a specific pressure is applied from the pressing roll 8 to the flexible substrate 4 for a specific time. At the same time, a portion, located at a position corresponding to that of the target device 3 is irradiated with an excimer laser beam 9 traveling from the back side, reversed to the side on which the first adhesive layer 2 is formed, of the base substrate 1, to heat and plasticize the portion, corresponding to the target device 3, of the first adhesive layer 2, thereby reducing an adhesive force of the plasticized portion of the first adhesive layer 2 to the target device 3. As a result, the target device 3 can be peeled from the base substrate 1. To be more specific, in the state that the target device 3 is peelable from the base substrate 1, the upper surface of the target device 3 is pressed by the flexible substrate 4. At this time, since the target device 3 is in contact with the flexible substrate 4 via the second adhesive layer 5 formed on the transfer plane of the flexible substrate 4, the target device 3 is fixed to the flexible substrate 4 by the adhesive force of the second adhesive layer 5. After that, by moving up the pressing roll 8, the flexible substrate 4 is separated from the base substrate 1, to complete the transfer of the target device 3 from the base substrate 1 to the flexible substrate 4.

Figure 5C:
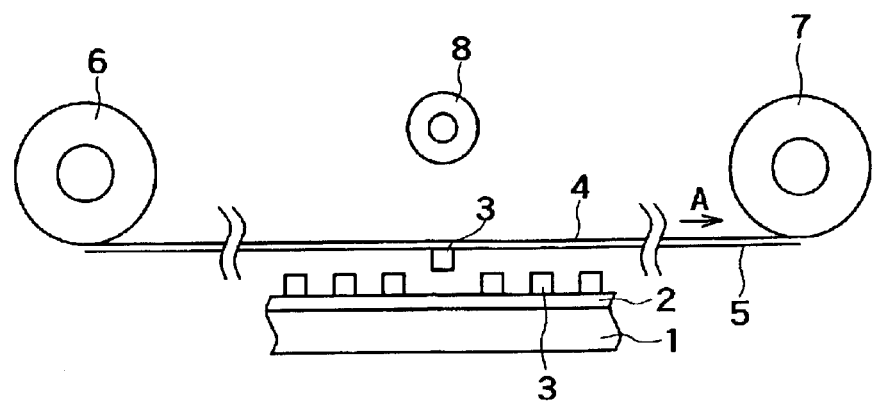

FIG. 5C shows a state that the flexible substrate 4 is separated from the base substrate 1 by moving up the pressing roll 8, to thereby transfer the target device 3 to the flexible substrate 4.

Figure 6A:
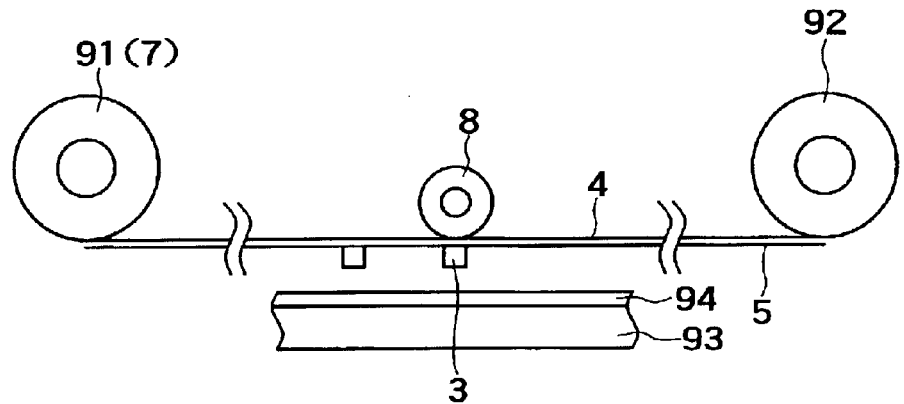
FIGS. 6A to 6C are schematic sectional views showing steps subsequent to the steps shown in FIGS. 5A to 5C.

As shown in FIG. 6A, the winding roll 7, around which the flexible substrate 4 holding the devices 3 transferred from the base substrate 1 has been wound, is taken as a unwinding roll 91, and the transfer of the devices 3 to a transfer substrate 93 is performed by using the unwinding roll 91. To be more specific, the unwinding roll 91, a winding roll 92, and the transfer substrate 93 are disposed in the same layout as that used for transfer of the devices 3 from the base substrate 1 to the flexible substrate 4. In addition, a third adhesive layer 94 made from a thermoplastic resin is previously formed on a principal plane, on which the devices 3 are to be transferred, of the transfer substrate 93.

The third adhesive layer 94 is not particularly limited insofar as it can adhesively bond the devices 3 to the transfer substrate 93 but may be suitably selected in consideration of various conditions, for example, the kinds of the devices 3. For example, the third adhesive layer 94 may be made from a material that exhibits a pressure-sensitive force when being heated, to adhesively bond the devices 3 to the transfer substrate 93. Such a material is exemplified by a thermoplastic material or a solder. The third adhesive layer 94 may be formed overall on the transfer plane of the transfer substrate 93 or formed only at positions, corresponding to those of the devices 3, of the transfer substrate 93.

Like the transfer of the devices 3 from the base substrate 1 to the flexible substrate 4, the transfer of the devices 3 from the flexible substrate 4 to the transfer substrate 93 is performed.

Figure 6B:
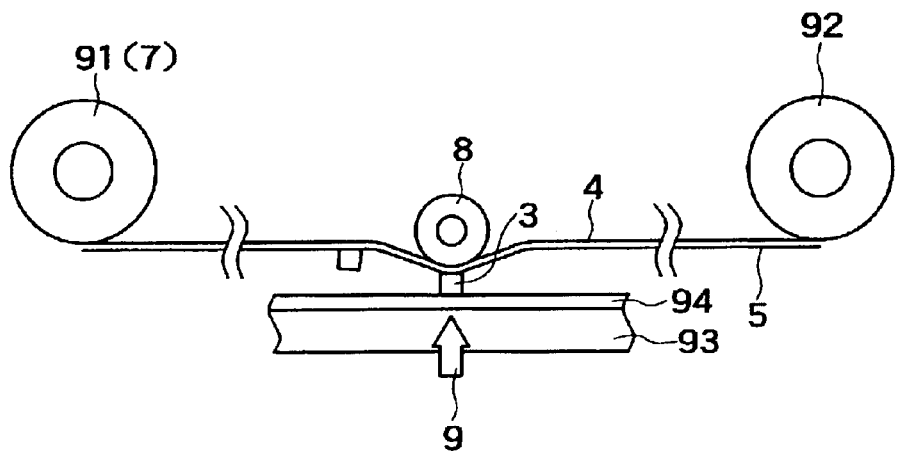

As shown in FIG. 6B, the pressing roll 8 is moved down to the flexible substrate 4 located opposite to the transfer substrate 93, and is brought into contact with the upper surface, that is, the principal plane on the side reversed to the side on which each of the devices 3 is held as transferred, of the flexible substrate 4, and then the pressing roll 8 is further moved down so as to bring the bottom of each of the target devices 3 having been transferred to the flexible substrate 4 into contact with the transfer substrate 93.

When the bottom of the target device 3 is brought into contact with the transfer substrate 93, the downward movement of the pressing roll 8 is stopped, and a specific pressure is applied from the pressing roll 8 to the flexible substrate 4 for a specific time. At the same time, a portion, located at a position corresponding to that of the target device 3, of the third adhesive layer 94 is irradiated with an excimer laser beam 9 traveling from the back side, reversed to the side on which the third adhesive layer 94 is formed, of the transfer substrate 93, to heat and melt the portion, corresponding to the target device 3, of the third adhesive layer 94, thereby producing an adhesive force of the melted portion of the third adhesive layer 94 to the target device 3. As a result, the target device 3 can be adhesively bonded to the transfer substrate 93. While the target device 3 is in contact with the third adhesive layer 94, the third adhesive layer 94 is cooled to be thus cured, so that the target device 3 is fixed to the transfer substrate 93. Finally, the pressing roll 8 is moved up to be separated from the flexible substrate 4, to complete the transfer of the target device 3 from the flexible substrate 4 to the transfer substrate 93.

Figure 6C:
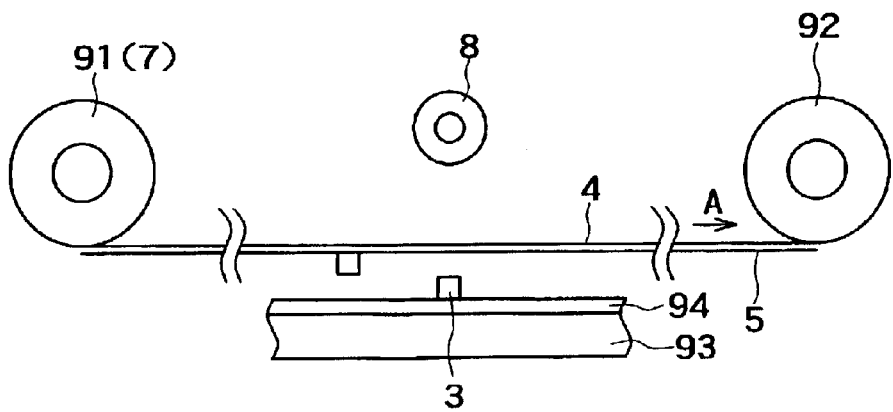

FIG. 6C shows a state that the pressing roll 8 is moved up to be separated from the base substrate 93, to thereby transfer the target device 3 to the transfer substrate 93.

The flexible substrate 4 is then fed by a specific distance in the direction A in FIG. 6C, and the above-described transfer step is repeated, with a result that a specific number of the devices 3 are transferred from the flexible substrate 4 to the transfer substrate 93 with a specific pitch.

According to the device transferring method described above, like the transfer of the devices 3 from the base substrate 1 to the flexible substrate 4, the transfer of the devices 3 from the flexible substrate 4 to the transfer substrate 93 can be performed with a high yield and a high reliability. Also, according to this transfer method, the enlarged transfer can be performed at a higher enlargement ratio as compared with the transfer of the devices 3 from the base substrate 1 to the flexible substrate 4. Even in this case, since the devices 3 arrayed not only in the longitudinal direction but also in the lateral direction of the flexible substrate 4 can be selectively transferred, it is possible to efficiently and simply perform the enlarged transfer both in the longitudinal and lateral directions of the flexible substrate 4.

Like the transfer of the devices 3 from the base substrate 1 to the flexible substrate 4, by using a number of the pressing rolls 8 arranged at specific intervals, the enlarged transfer of the devices 3 arrayed in a matrix can be performed with a specific pitch in each of the longitudinal and lateral directions of the flexible substrate 4. In this case, since a large number of the devices, which is proportional to the number of the pressing rolls 8, can be transferred at once, it is possible to more efficiently perform the transfer of the devices. Also, like the transfer of the devices from the base substrate 1 to the flexible substrate 4, a number of different kinds of devices can be efficiently transferred. Further, like the transfer of the devices from the base substrate 1 to the flexible substrate 4, since a flexible wiring substrate on which wiring portions for electrical connection to electrodes of the devices 3 are previously formed can be used as the transfer substrate 93, it is possible to omit an additional step of electrically connecting the devices 3 to the transfer substrate 93, and hence to efficiently fabricate an image display unit using the devices 3 at a low cost. As a result, according to this device transferring method, it is possible not only to obtain the same effect as that obtained by the transfer of the devices 3 from the base substrate 1 to the flexible substrate 4 but also to perform the enlarged transfer at a higher enlargement ratio as compared with the transfer of the devices 3 from the base substrate 1 to the flexible substrate 4.

As an application example of the above-described device transferring method, there will be described a device arraying method and an image display unit fabrication method using a two-step enlarged transfer method.

The two-step enlarged transfer method, used for the device arraying method and the image display unit fabrication method as one application example of the device transferring method of the present invention, is carried out by transferring devices formed on a first substrate at a high density to a temporarily holding member such that the devices are enlargedly spaced from each other with a pitch larger than a pitch of the devices arrayed on the first substrate, and further transferring the devices held on the temporarily holding member to a second substrate such that the devices are enlargedly spaced from each other with a pitch larger than the pitch of the devices held on the temporarily holding member. It is to be noted that two-step transfer is adopted in this embodiment, multi-step transfer such as three or more-step transfer can be adopted in accordance with a required enlargement ratio between the pitch of the devices arrayed on the first substrate and the pitch of the devices mounted on the second substrate.

FIGS. 7A to 7D show basic steps of a two-step enlarged transfer method. First, devices 12 such as light emitting devices are densely formed on a first substrate 10 shown in FIG. 7A. By densely forming devices on a substrate, the number of devices formed per each substrate can be increased, thereby reducing the associated production costs. The first substrate 10 may be a substrate on which devices can be formed, for example, a semiconductor wafer, a glass substrate, a quartz glass substrate, a sapphire substrate, or a plastic substrate. The devices 12 may be directly formed on the first substrate 10, or may be formed once on a substrate different from the first substrate 10, and then transferred and arrayed on the first substrate 10.

The devices 12 are subjected to a first transfer step as shown in FIG. 7B, in which the devices 12 are transferred from the first substrate 10 to a first temporarily holding member 11 shown by a broken line in FIG. 7B, and held on the first temporarily holding member 11. Here, as shown in FIG. 7B, the devices 12 are arrayed in a matrix in which the adjacent two of the devices 12 are enlargedly spaced from each other. Specifically, to array the devices 12 in the matrix shown in FIG. 7B, the transfer of the devices 12 is made such that the devices 12 are enlargedly spaced from each other not only in the X direction but also in the Y direction perpendicular to the X direction. The enlarged distance for each of the adjacent devices 12 may be set, while not limited thereto, in consideration of production of resin-covered chips and formation of electrode pads thereon in the subsequent steps. In addition, when the devices 12 are transferred from the first substrate 10 to the temporarily holding member 11, the devices 12 on the first substrate 10 can be all transferred to the first temporarily holding member 11 such as to be enlargedly spaced from each other. In this case, a size of the first temporarily holding member 11 in each of the X direction and the Y direction may be equal to or more than a value obtained by multiplying the enlarged distance by the number of those, arrayed in each of the X direction and the Y direction, of the devices 12 arrayed in the matrix. Alternatively, part of the devices 12 on the first substrate 10 may be transferred to the first temporarily holding member 11 such as to be enlargedly spaced from each other.

After the first transfer step, each of the devices 12 enlargedly spaced from each other on the first temporarily holding member 11 is, as shown in FIG. 7C, covered with a resin, and electrode pads are formed on the resin covering the device 12. The covering of each device 12 with the resin is made so as to facilitate the formation of the electrode pads for the device 12 and to facilitate the handling of the device 12 in a second transfer step subsequent thereto. To prevent occurrence of a wiring failure in a final wiring step, which is performed after the second transfer step (as will be described later), the electrode pads are formed into relatively large sizes. It is to be noted that the electrode pads are not shown in FIG. 7C. As enlargedly shown in FIG. 7C, a resin-covered chip 14 is thus formed by covering each of the devices 12 with a resin 13. The device 12 is located at an approximately central portion of the resin-covered chip 14 in a plan view according to this embodiment. However, the device 12 may be located at a position offset to one side or a corner of the resin-covered chip 14.

The devices 12 are then subjected to the second transfer step shown in FIG. 7D. In this second transfer step, the devices 12 arrayed in the matrix on the first temporarily holding member 11 in the form of the resin-covered chips 14 are transferred on a second substrate 15 such as to be more enlargedly spaced from each other. It is to be noted that the above-described device transferring method is applied to the second transfer step as will be described later.

Even in the second transfer step, the devices 12 are arrayed in a matrix shown in FIG. 7D, in which each of the adjacent devices 12 in the form of the resin-covered chips 14 is more enlargedly spaced from each other. Specifically, to array the devices 12 in the matrix shown in FIG. 7D, the devices 12 are transferred such as to be more enlargedly spaced from each other not only in the X direction but also in the Y direction perpendicular to the X direction. If positions of the devices 12 arrayed by the second transfer step correspond to positions of pixels of a final product such as an image display unit, a pitch of the devices 12 arrayed by the second transfer step becomes about an integer times an original pitch of the devices 12 arrayed on the first substrate 10. It is now assumed that an enlargement ratio between the pitch of the devices 12 held on the first temporarily holding member 11 and the pitch of the devices 12 arrayed on the first substrate 10 is taken as "n" and an enlargement ratio between the pitch of the devices 12 arrayed on the second substrate 15 and the pitch of the devices 12 held on the first temporarily holding member 11 is taken as "m". On this assumption, a value E of the above-described about an integer times is expressed by E=n×m.

The devices 12 in the form of the resin-covered chips 14, which have been transferred in the second substrate 15 such as to be sufficiently enlargedly spaced from each other, are then subjected to wiring. The wiring is performed with care taken not to cause a connection failure by making use of the previously formed electrode pads and the like. If the devices 12 are light emitting devices such as light emitting diodes, the wiring includes wiring to p-electrodes and n-electrodes, and if the devices 12 are liquid crystal control devices, the wiring includes wiring to selective signal lines, voltage lines, alignment electrode films, and the like.

In the two-step enlarged transfer method shown in FIGS. 7A to 7D, the covering of each of the devices 12 with a resin and the formation of electrode pads on the resin covering the device 12 (that is, the resin-covered chip 14) can be performed by making use of the enlarged distance for each of the adjacent devices 12 after the first transfer, and wiring can be performed after the second transfer without the occurrence of a connection failure by making use of the previously formed electrode pads and the like. As a result, it is possible to improve a production yield of the image display unit. Also, in the two-step enlarged transfer method according to this embodiment, two enlarged transfer steps in which each of the devices are enlargedly spaced from each other are carried out. In general, by performing a number of such enlarged transfer steps in which each of the devices are enlargedly spaced from each other, the number of transfer can be reduced. For example, it is now assumed that an enlargement ratio between the pitch of the devices 12 on the first temporarily holding member 11 and the pitch of the devices 12 on the first substrate 10 is taken as 2(n=2) and an enlargement ratio between the pitch of the devices 12 on the second substrate 15 and the pitch of the devices 12 on the first temporarily holding member 11 is taken as 2(m=2). In this case, the total enlargement ratio becomes 2×2=4. To realize the total enlargement ratio (=4), according to a one-step transfer method, the number of transfer (alignment) of the devices 12 from the first substrate 10 to the second substrate 15 becomes 16 times as a result of squaring the total enlargement ratio (=4). On the contrary, to realize the same total enlargement ratio (=4), according to the two-step enlarged transfer method of this embodiment, the number of transfer (alignment) is obtained by simply adding a square of the enlargement ratio (=2) in the second transfer step to a square of the enlargement ratio (=2) in the first transfer step, and therefore, the number of transfer becomes eight times as a result of adding $4(2^2)$ to $4(2^2)$. Generally, to achieve the transfer magnification of n×m, according to the two-step enlarged transfer method, the number of transfer becomes $(n^2+m^2)$ times, whereas according to the one-step transfer method, the number of transfer becomes $(n+m)^2=n^2+2nm+m^2$. Consequently, according to the two-step enlarged transfer method, the number of transfer can be reduced by 2nm times, and thereby the time and the cost required for the production step can be correspondingly saved. This is particularly advantageous in the case of transfer at a larger transfer magnification (enlargement ratio).

In the two-step enlarged transfer method shown in FIGS. 7A to 7D, the device 12 is exemplified by a light emitting device. However, it is not limited thereto but may be configured as another device selected from a liquid crystal control device, a photoelectric conversion device, a piezoelectric device, a thin film transistor device, a thin film diode device, a resistance device, a switching device, a micro-magnetic device, and a micro-optical device, or part of such a device or a combination of these devices.

Figure 8:
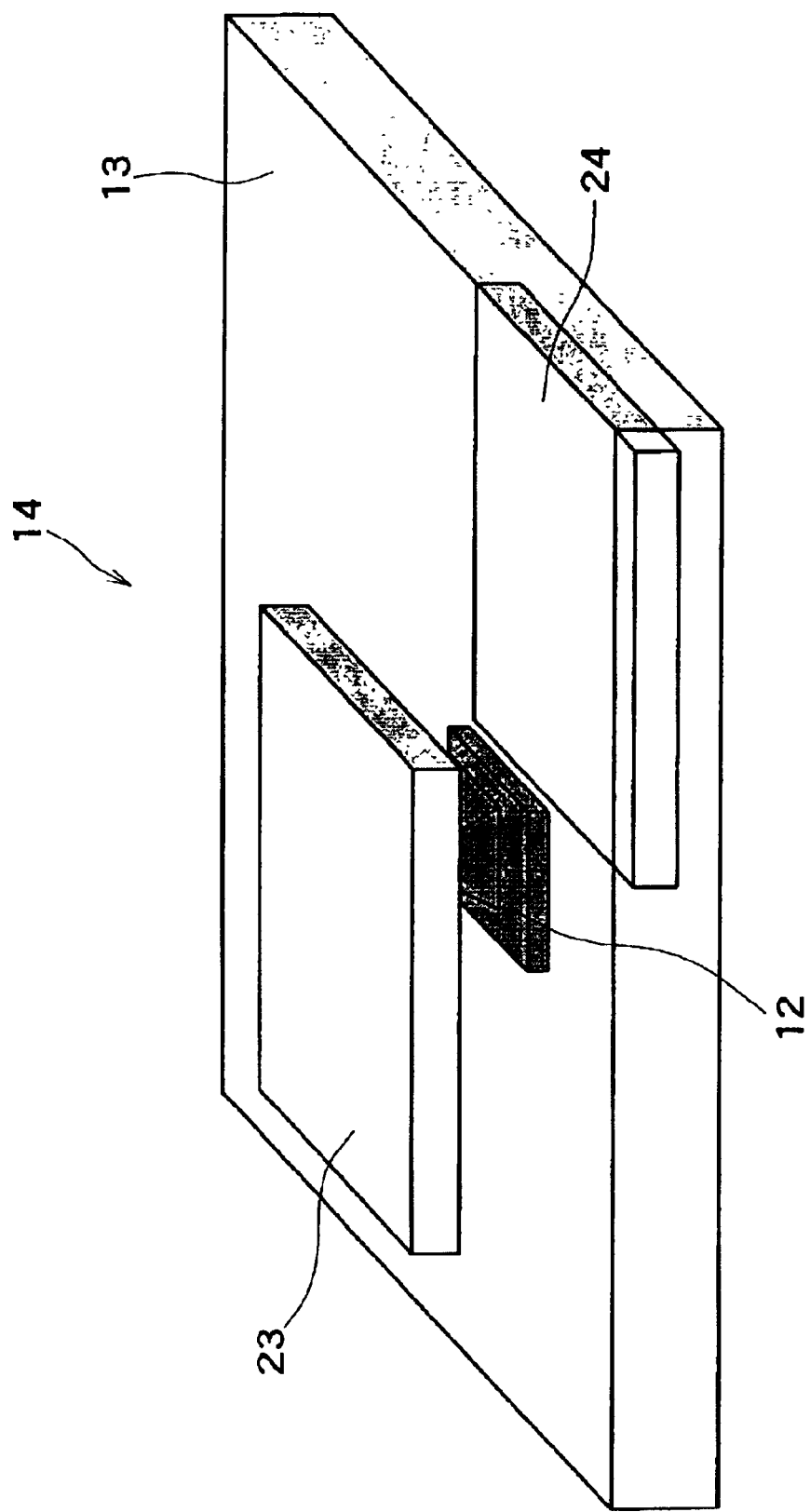
FIG. 8 is a schematic perspective view of a resin-covered chip.
Figure 9:
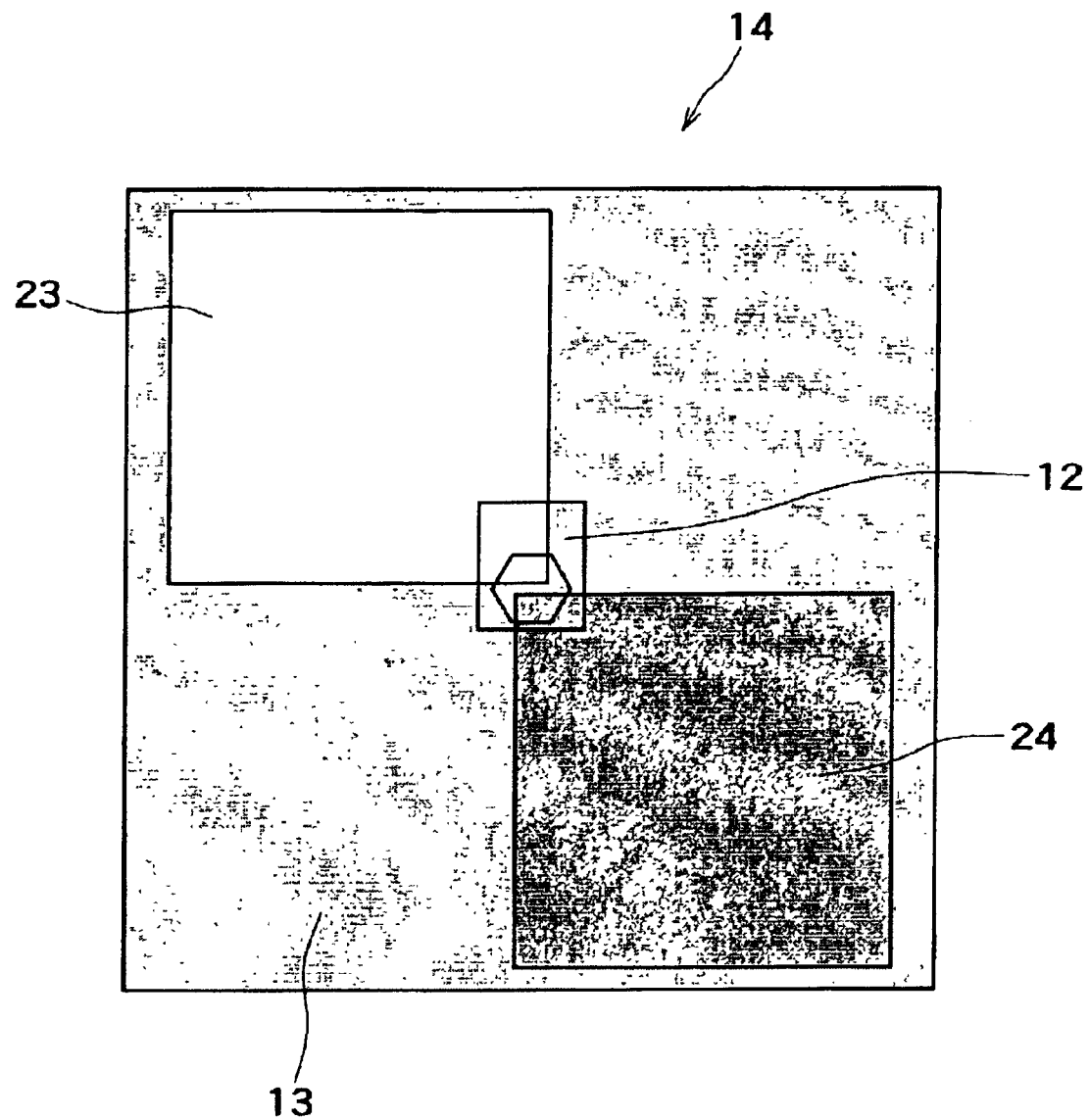
FIG. 9 is a schematic plan view of the resin-covered chip shown in FIG. 8.

In the above two-step transfer method, the device 12 is handled in the form of a resin-covered chip, for example, at the time of transfer of the device 12 from the first temporarily holding member to the second substrate. Such a resin-covered chip will be described below with reference to FIGS. 8 and 9.

The resin-covered chip 14 is formed by covering each of the devices 12, which are held on the first temporarily holding member such as to be spaced from each other, with the resin 13 and curing the resin 13. Such a resin-covered chip 13 is used at the time of transfer of the device 12 from the first temporarily holding member to the second substrate.

The resin-covered chip 14 is formed into an approximately flat plate shape with an approximately square shaped principal plane. The resin-covered chip 14 is formed by covering the device 12 with the resin 13 and curing the resin 13. Specifically, a number of the resin-covered chips 14 are formed by coating the overall surface of the first temporarily holding member 11 so as to cover the devices 12 with a non-cured resin, curing the resin, and cutting the cured resin 14 into approximately square chips shown in FIGS. 8 and 9 by dicing.

Electrode pads 23 and 24 are formed on front and back surfaces of the approximately flat resin 13 of the resin-covered chip 14, respectively. These electrode pads 23 and 24 are each produced by forming a conductive layer made from a metal or polysilicon as a material of each of the electrode pads 23 and 24 overall on each of the front and back surfaces of the resin 13, and patterning the conductive layer into each specific electrode shape by photolithography. These electrode pads 23 and 24 are formed so as to be connected to a p-electrode and an n-electrode of the device 12 as the light emitting device, respectively. If needed, via-holes may be formed in the resin 13 of the resin-covered chip 14.

The electrode pads 23 and 24 are formed on the front and back surface sides of the resin-covered chip 14, respectively, in this embodiment. However, they may be formed on either of the front and back surface sides of the resin-covered chip 14. Further, for a thin film transistor having three electrodes, that is, a source electrode, a gate electrode, and a drain electrode, three or more electrode pads may be formed. It is to be noted that the electrode pads 23 and 24 are offset from each other in a plan view in order to prevent the electrode pads 23 and 24 from being overlapped to each other when a contact hole is formed from above at the time of formation of final wiring. The shape of each of the electrode pads 23 and 24 is not limited to a square shape but may be any other suitable shape.

The formation of such a resin-covered chip 14 is advantageous in that since the device 12 is covered with the flattened resin 13, the electrode pads 23 and 24 can be accurately formed on the flattened front and back surfaces of the resin 13, and also the electrode pads 23 and 24 can be formed so as to extend to a region wider than the size of the device 12. As will be described later, since final wiring is performed after the second transfer step, a wiring failure can be prevented by performing wiring using the electrode pads 23 and 24 having relatively large sizes.

Figure 10A:
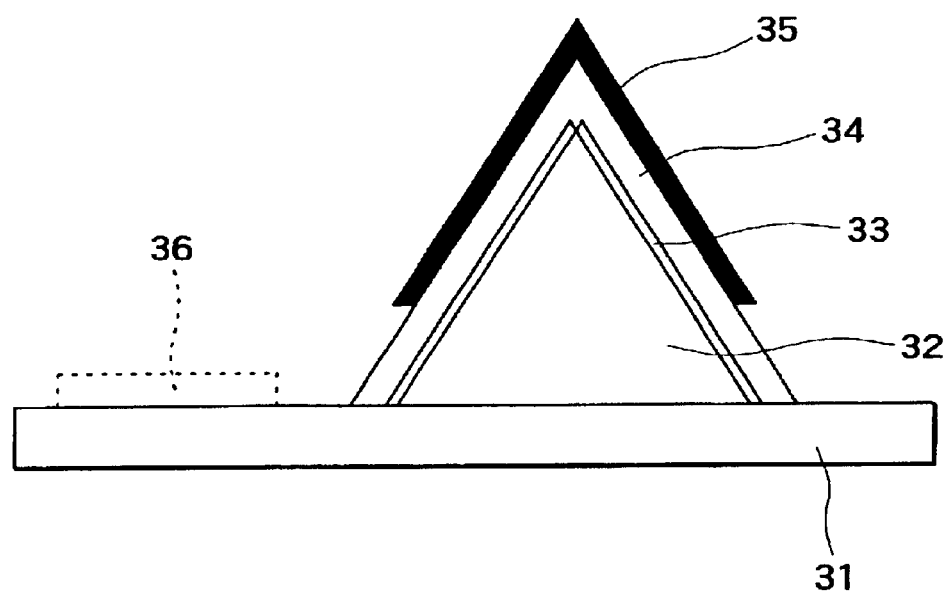
FIGS. 10A and 10B are a sectional view and a plan view showing one example of a light emitting device, respectively.
Figure 10B:
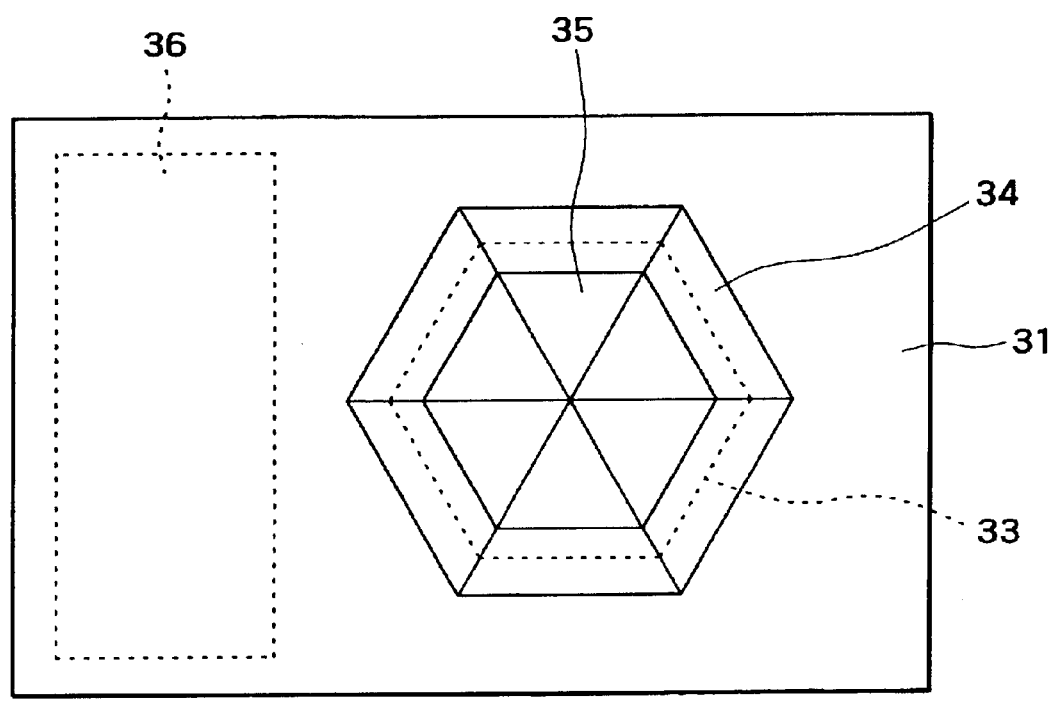

FIGS. 10A and 10B show a structure of a light emitting device as one example of the device used in the two-step enlarged transfer method according to this embodiment, wherein FIG. 10A is a sectional view of the device and FIG. 10B is a plan view of the device. The light emitting device shown in the figure is exemplified by a GaN based light emitting diode formed, for example, on a sapphire substrate by crystal growth. In this GaN based light emitting diode, when the light emitting diode is irradiated with a laser beam passing through the substrate, laser abrasion occurs, to evaporate nitrogen of GaN, thereby causing film peeling at an interface between the sapphire substrate and a GaN based growth layer. As a result, device peeling can be easily performed.

The structure of the GaN based light emitting diode will be described below. A hexagonal pyramid shaped GaN layer 32 is formed by selective growth on an under growth layer 31 composed of a GaN based semiconductor layer. An insulating film (not shown) is formed on the under growth layer 31, and the hexagonal pyramid shaped GaN layer 32 is grown from an opening formed in the insulating film by a MOCVD process or the like. The GaN layer 32 is a growth layer having a pyramid shape covered with a S-plane, that is, (1-101) plane when a principal plane of a sapphire substrate used for growth is taken as a C-plane. The GaN layer 32 is a region doped with silicon. The tilt or slanted S-plane portion of the GaN layer 32 functions as a cladding portion of a double-hetero structure. An InGaN layer 33 functioning as an active layer is formed such as to cover the tilt S-plane of the GaN layer 32. A GaN layer 34 doped with magnesium is formed on the InGaN layer 33. The GaN layer 34 doped with magnesium also functions as a cladding portion.

The light emitting diode has a p-electrode 35 and an n-electrode 36. A metal material such as Ni/Pt/Au or Ni(Pd)/Pt/Au is vapor-deposited on the GaN layer 34 doped with magnesium, to form the p-electrode 35. A metal material such as Ti/Al/Pt/Au is vapor-deposited in an opening formed in the above-described insulating film (not shown), to form the n-electrode 36. When extracting an n-electrode from a back surface side of the under growth layer 31, the n-electrode 36 is not required to be formed on the front surface side of the under growth layer 31.

The GaN based light emitting diode having such a structure enables light emission of blue. In particular, such a light emitting diode can be relatively simply peeled from the sapphire substrate by laser abrasion. In other words, the diode can be selectively peeled by selective irradiation of the diode with a laser beam. In addition, the GaN based light emitting diode may have a structure that an active layer is formed into a planar or strip shape, or may be a pyramid structure with a C-plane formed on an upper end portion of the pyramid. The GaN light emitting diode may be also replaced with any other nitride based light emitting device or a compound semiconductor device.

Figure 11:
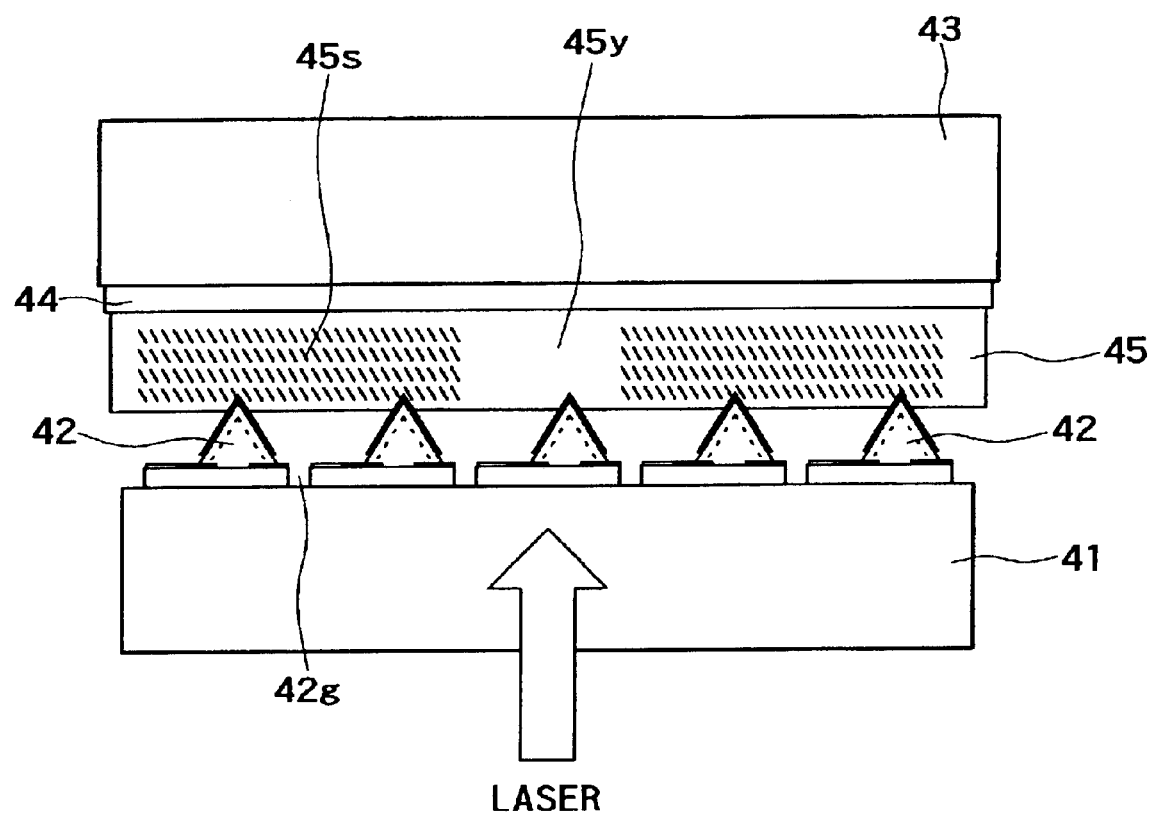
FIG. 11 is schematic sectional view of a first transfer step of a method of fabricating an image display unit using the light emitting devices shown in FIGS. 10A and 10B, to which the device arraying method shown in FIGS. 7A to 7D are applied.
Figure 12:
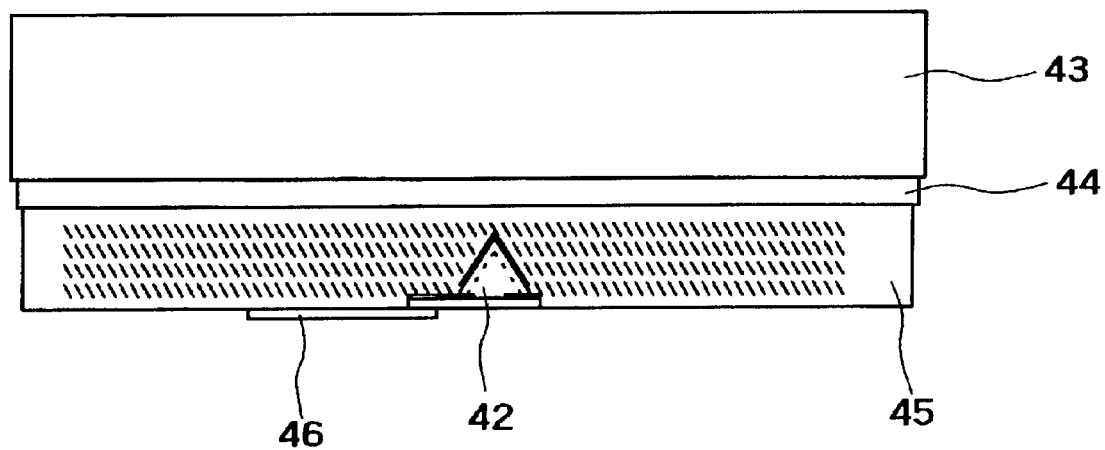
FIG. 12 is a schematic sectional view showing a cathode electrode pad formation step subsequent to the step shown in FIG. 11.

A specific embodiment using the method of arraying the light emitting devices already described with reference to FIGS. 7A to 7D will described below with reference to FIGS. 11 to 18. In this embodiment, the GAN based light emitting diodes shown in FIGS. 10A and 10B are used as the light emitting devices. First, as shown in FIG. 11, a number of light emitting diodes 42 are formed in a matrix on a principal plane of a first substrate 41. A size of the light emitting device 42 is set to about 20 m. The first substrate 41 is made from a material, for example, a sapphire substrate having a high transmittance for a laser beam having a specific wavelength suitably used for irradiation of the light emitting diode 42. The light emitting diodes 42 are in the state that electrodes such as p-electrodes have been already formed but final wiring is not yet performed, and that device isolation grooves 42g are formed and thereby the light emitting diodes 42 are isolatable from each other. The grooves 42g are formed, for example, by reactive ion etching. As shown in FIG. 12, such a first substrate 41 is placed opposite to a first temporarily holding member 43 for selective transfer of the light emitting diodes 42 therebetween.

Both a peelable layer 44 and an adhesive layer 45 are formed on a surface, opposed to the first substrate 41, of the first temporarily holding member 43. The first temporarily holding member 43 may be made from a glass substrate, a quartz glass substrate, or a plastic substrate. The peelable layer 44 on the first temporarily holding member 43 can be made from a fluorine coat material, a silicone resin, a water soluble adhesive (for example, polyvinyl alcohol: PVA), or polyimide. The adhesive layer 45 on the first temporarily holding member 43 can be made from an ultraviolet (UV) curing type adhesive, a thermosetting type adhesive, or a thermoplastic type adhesive. As one embodiment, a quartz glass substrate is used as the first temporarily holding member 43, and a polyimide film is formed as the peelable layer 44 on the first temporarily holding member 43 to a thickness of 4 m and an UV-curing type adhesive layer is formed as the adhesive layer 45 on the peelable layer 44 to a thickness of about 20 m.

The adhesive layer 45 on the first temporarily holding member 43 is adjusted such that cured regions 45s and non-cured regions 45y are mixed. The first substrate 41 is positioned to the first temporarily holding member 43 such that the light emitting diodes 42 to be selectively transferred are located at the non-cured regions 45y. The adjustment of the adhesive layer 45 such that the cured regions 45s and the non-cured regions 45y are mixed may be performed by selectively exposing a UV-curing type adhesive with a pitch of 200 m by an exposure system, so that portions of the adhesive layer 45 to which the light emitting diodes 42 are to be transferred remain non-cured and the other portions are cured. After such selective curing of the adhesive layer 45, each of the light emitting diodes 42 to be transferred is irradiated with a laser beam from the back surface of the first substrate 41, and is then peeled from the first substrate 41 by laser abrasion. Since the GaN based light emitting diode 42 is decomposed into gallium and nitrogen at the interface between the GaN layer and sapphire, the light emitting diode 42 can be relatively simply peeled from the first substrate 41. The laser beam used for irradiation is exemplified by an excimer laser beam or a harmonic YAG laser beam.

The light emitting diode 42, which has been selectively irradiated with a laser beam, is peeled from the first substrate 41 at the interface between the GaN layer and the first substrate 41 by laser abrasion, and is transferred to the opposed first temporarily holding member 43 such that the p-electrode portion of the light emitting diode 42 is placed in the corresponding non-cured region 45y of the adhesive layer 45. The other light emitting diodes 42, which are not irradiated with laser beams and located at positions corresponding to the cured region 45s of the adhesive layer 45, are not transferred to the first temporarily holding member 43. It is to be noted that, in the example shown in FIG. 11, only one light emitting diode 42 is selectively irradiated with a laser beam. However, in actuality, the light emitting diodes 42 spaced from each other with an n-pitch are similarly irradiated with laser beams. With such selective transfer, the light emitting diodes 42 are arrayed on the first temporarily holding member 43 such as to be enlargedly spaced from each other with a pitch larger than an original pitch of the light emitting diodes 42 arrayed on the first substrate 41.

While the light emitting diode 42 is being held by the adhesive layer 45 of the first temporarily holding member 43, the back surface of the light emitting diode 42, which is taken as an n-electrode side (cathode electrode side), is cleaned for removal of the resin (adhesive) therefrom. Accordingly, when an electrode pad 46 is formed on the back surface of the light emitting diode 42 as shown in FIG. 12, it can be electrically connected thereto.

The cleaning of the adhesive layer 45 may be performed, for example, by etching the resin used as the adhesive with oxygen plasma and cleaning it by irradiation of UV ozone. When the GaN based light emitting diode is peeled from the first substrate 41 made from sapphire substrate by laser irradiation, gallium is deposited on the peeling plane. Such an element Ga must be etched, for example, by using an NaOH containing water solution or diluted nitric acid. The electrode pad 46 is then formed by patterning. The electrode pad 46 on the cathode side can be formed into a size of about 60 m square. As the electrode pad 46, there can be used a transparent electrode (ITO or ZnO based electrode) or a Ti/Al/Pt/Au electrode. When using such a transparent electrode, even if the electrode largely covers the back surface of the light emitting diode, it does not shield light emission. Accordingly, a patterning accuracy of the transparent electrode may be rough and the size of the electrode can be made large, to thereby facilitate the patterning process.

Figure 13:
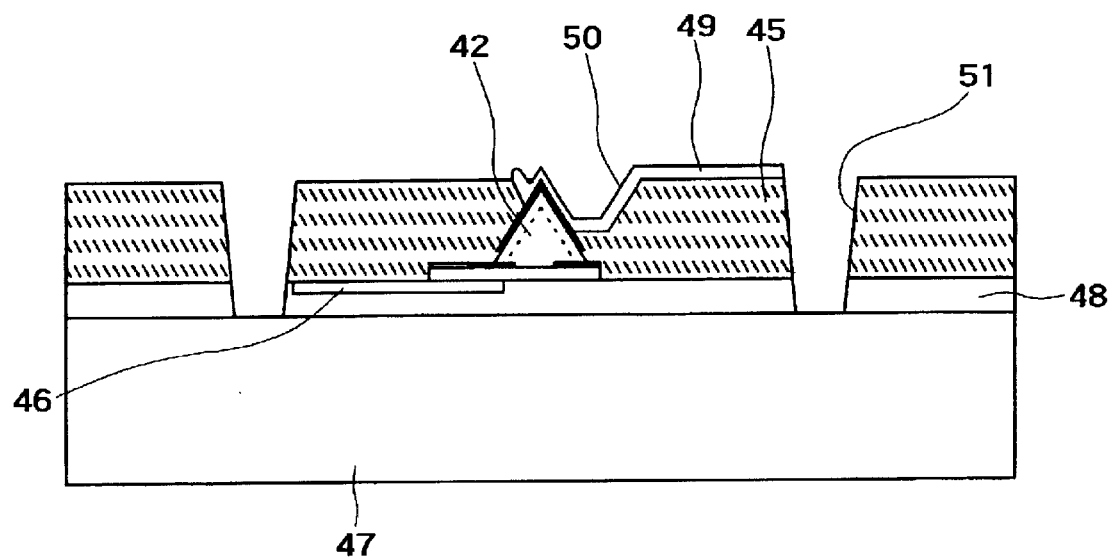
FIG. 13 is a schematic sectional view showing an anode electrode pad formation step after transfer to a second temporarily holding member, which step is subsequent to the step shown in FIG. 12.

Referring to FIG. 13, after the light emitting diode 42 is transferred from the first temporarily holding member 43 to a second temporarily holding member 47, a via-hole 50 on an anode electrode (p-electrode) side is formed in the adhesive layer 45 and an anode side electrode pad 49 is formed so as to be buried in the via-hole 50. The adhesive layer 45 made from the resin is then diced. As a result of dicing, device isolation grooves 51 are formed, to isolate the light emitting diode 42 from the adjacent light emitting diodes 42. To isolate the light emitting diodes 42 arrayed in a matrix from each other, the device isolation grooves 51 have a planar pattern composed of a number of parallel lines extending in the vertical and horizontal directions. From the bottom of the device isolation groove 51, the front surface of the second temporarily holding member 47 is exposed.

A peelable layer 48 is formed on the second temporarily holding member 47. The peelable layer 48 can be made from a fluorine coat material, a silicone resin, a water soluble resin (for example, PVA), polyimide, or the like. The second temporarily holding member 47 is exemplified by a so-called dicing sheet composed of a plastic substrate coated with an UV adhesive whose adhesive strength becomes weak by irradiation of ultraviolet rays.

In the transfer from the first temporarily holding member 43 to the second temporarily holding member 47, the peelable layer 44 is irradiated with an excimer laser from the back surface, opposed to the peelable layer 44 side, of the first temporarily holding member 43. If the peelable layer 44 is made from polyimide and the first temporarily holding member 43 is made from quartz, the peelable layer 44 is peeled by abrasion of polyimide at the interface between polyimide and quartz, with a result that each light emitting diode 42 is transferred to the second temporarily holding member 47.

When forming the anode electrode pad 49, the surface of the adhesive layer 45 is etched with oxygen plasma until the surface of the light emitting diode 42 is exposed. The via-hole 50 may be formed by using an excimer laser, a harmonic YAG laser beam, or a carbon dioxide laser beam. The diameter of the via-hole 50 is set to about 3 to 7 m. The anode side electrode pad 49 is made from Ni/Pt/Au. The dicing is made by a mechanical dicing method using a blade. If a narrow cut-in width of 20 m or less is needed, the dicing is made by a laser dicing method using a laser beam. The cut-in width is dependent on the size of the light emitting diode 42 covered with the adhesive layer 45 made from resin within a pixel of an image display unit.

The light emitting devices 42 are then transferred from the second temporarily holding member 47 to a second substrate 60. This transfer is performed by making use of the above-described transfer method using a flexible substrate.

Figure 14A:
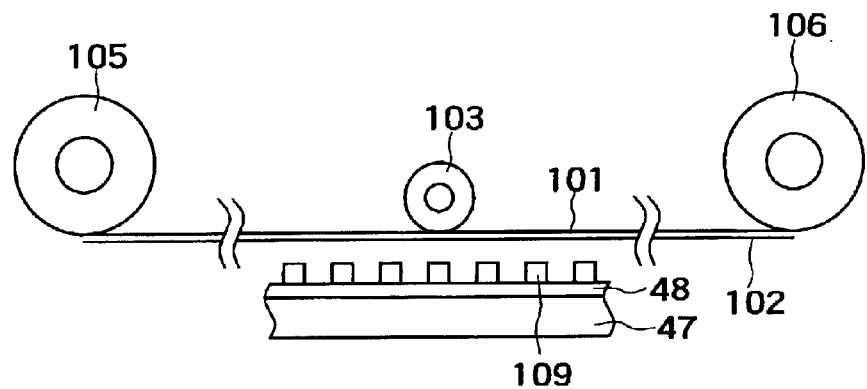
FIGS. 14A to 14C are schematic sectional views showing steps of a transfer process to which a device transferring according to an embodiment of the present invention is applied, which steps are subsequent to the step shown in FIG. 13.
Figure 14B:
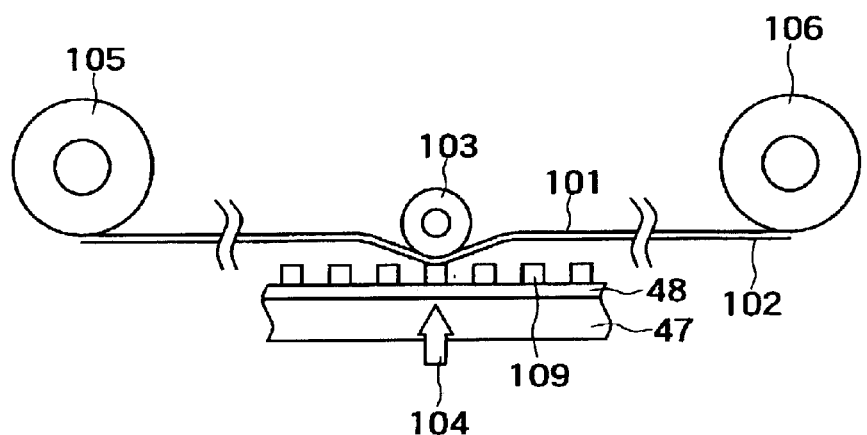

As shown in FIG. 14A, a flexible third temporarily holding member 101 including a third adhesive layer 102 having a weak adhesive force is disposed opposite to the second temporarily holding member 47. In such a state, a pressing roll 103 is moved down to be brought into contact with the upper surface of the third temporarily holding member 101, that is, a principal plane, on the side reversed to the side on which the third adhesive layer 102 is formed, of the third temporarily holding member 101. The pressing roll 103 is further moved down to cause, as shown in FIG. 14B, the third adhesive layer 102 of the third temporarily holding member 101 to be brought into contact with the upper surfaces of those, to be transferred, of resin-covered chips 109 (light emitting diodes 42 covered with the adhesive layer 45). When the third temporarily holding member 101 is brought into contact with the target resin-covered chips 109, the downward movement of the pressing roll 103 is stopped, and a specific pressure is applied to the third temporarily holding member 101 for a specific time.

At this time, a portion, located at a position corresponding to a position of each of the target resin-covered chips 109, of the peelable layer 48 is irradiated with a laser beam 104 traveling from the back surface side, reversed to the side on which the resin-covered chips 109 are formed. If the peelable layer 48 is made from polyimide and the second temporarily holding member 47 is made from quartz, film peeling occurs at the interface between polyimide and quartz as a result of abrasion of polyimide, whereby each of the resin-covered chips 109 containing the light emitting devices 42 is transferred from the second temporarily holding member 47 to the third temporarily folding member 101. The pressing roll 103 is then moved up to be separated from the third temporarily holding member 101. The transfer of the resin-covered chips 109 from the second temporarily holding member 47 to the third temporarily holding member 101 is thus completed.

Figure 14C:
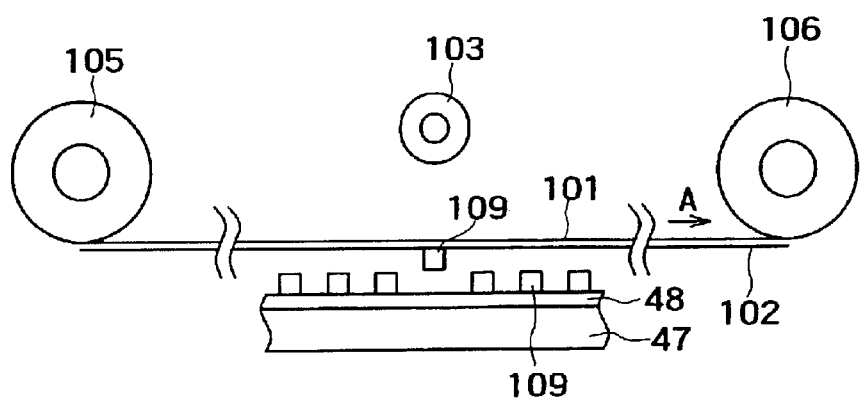

FIG. 14C shows the state that the pressing roll 103 is moved up to be separated from the third temporarily holding member 101, wherein the resin-covered chip 109 is held as transferred on the third temporarily holding member 101. It is to be noted that at the time of transfer, the third temporarily holding member 101 is unwound from an unwinding roll 105, and after transfer of the resin-covered chips, the third temporarily holding member 101 is wound around a winding roll 106.

Figure 15A:
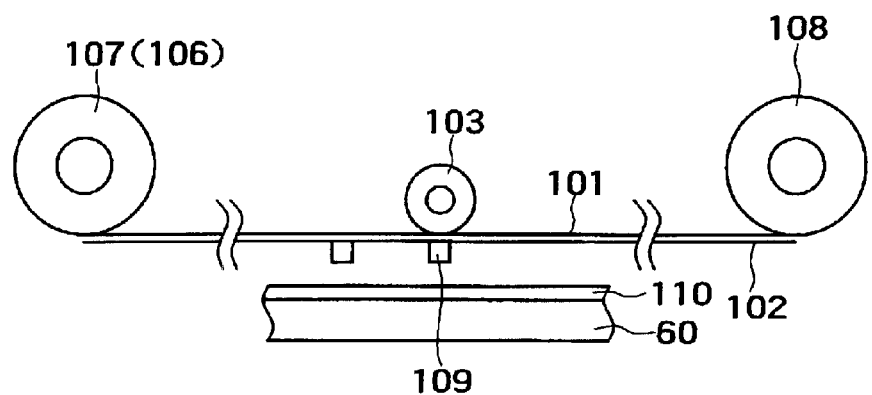
FIGS. 15A to 15C are schematic sectional views showing transfer steps subsequent to the steps shown in FIGS. 14A to 14C.

After the third temporarily holding member 101 to which the resin-covered chips 109 has been transferred is wound around the winding roll 106, the winding roll 106 is used as an unwinding roll 107 for transferring the resin-covered chips 109 from the third temporarily holding member 101 to the second substrate 60. As shown in FIG. 15A, the unwinding roll 107, a winding roll 108, and the second substrate 60 are arranged in a layout similar to the above-described layout for transfer of the resin-covered chips 109 from the second temporarily holding member 47 to the third temporarily holding member 101. A fourth adhesive layer 110 made from a thermoplastic resin is formed on a principal plane, on which the resin-covered chips 109 are to be transferred, of the second substrate 60.

Figure 15B:
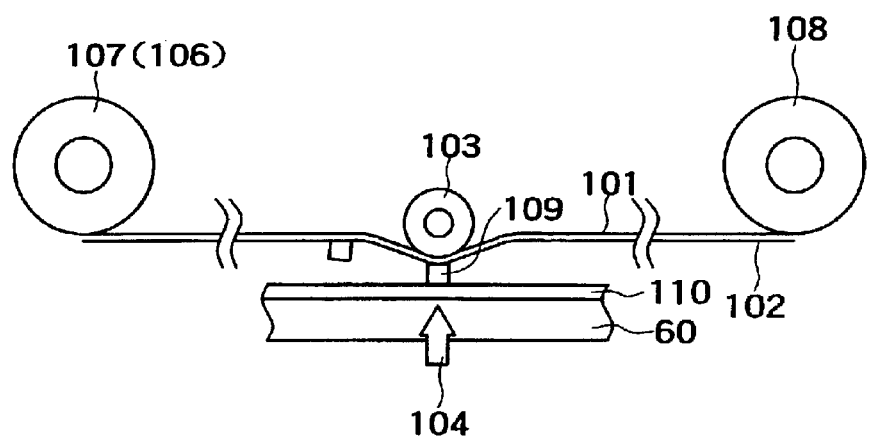

As shown in FIG. 15B, the third temporarily holding member 101 is disposed opposite to the second substrate 60. In such a state, the pressing roll 103 is moved down to be brought into contact with the upper surface of the third temporarily holding member 101, that is, a principal plane, on the side reversed to the side on which the resin-covered chips 109 are held as transferred, of the third temporarily holding member 101. The pressing roll 103 is further moved down, to cause the bottom surfaces of those, to be transferred, of the resin-formed chips 109 held as transferred on the third temporarily holding member 101 to be brought into contact with the second substrate 60. When the bottom surfaces of the target resin-covered chips 109 are brought into contact with the second substrate 60, the downward movement of the pressing roll 103 is stopped, and a specific pressure is applied to the third temporarily holding member 101 for a specific time. At this time, a portion, located at a position corresponding to a position of each of the target resin-covered chips 109, of the fourth adhesive layer 110 is irradiated with a laser beam 104 traveling from the back surface side, reversed to the side on which the fourth adhesive layer 110 is formed, of the second substrate 60, to heat the portion, corresponding to each of the target resin-covered chips 109, of the fourth adhesive layer 110. As a result, the target resin-covered chips 109 are adhesively bonded to the second substrate 60. The fourth adhesive layer 110 is then cooled while the target resin-covered chips 109 are in contact therewith, to harden the fourth adhesive layer 110, whereby the target resin-covered chips 109 are fixed to the second substrate 60. The pressing roll 103 is then moved up to be separated from the third temporarily holding member 101. The transfer of the resin-covered chips 109 containing the light emitting diodes 42 from the third temporarily holding member 101 to the second substrate 60 is thus completed.

Figure 15C:
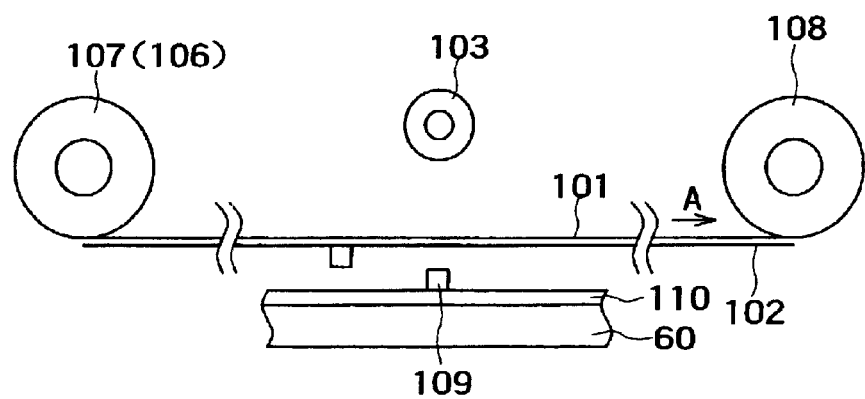

FIG. 15C shows the state in which the pressing roll 103 is moved up to be separated from the third temporarily holding member 101, wherein the resin-covered chips 109 are held as transferred on the second substrate 60. The third temporarily holding member 101 is then fed by a specific amount in a direction shown by an arrow A shown in FIG. 15C, followed by repeating the above step, to transfer the resin-covered chips 109 containing the light emitting diodes 42 to the second substrate 60 with a desired pitch.

Figure 16:
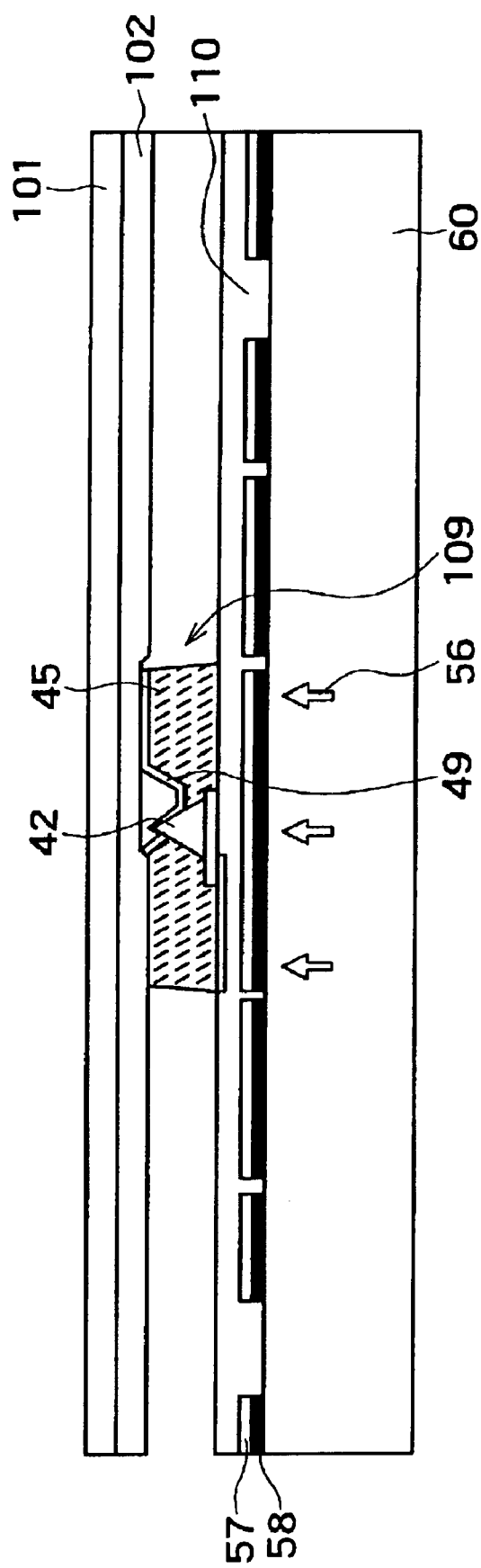
FIG. 16 is a schematic sectional view showing a transfer step subsequent to the steps shown in FIGS. 15A to 15C.

An electrode layer 57, which also functions as a shadow mask, is disposed on the second substrate 60. In this case, the fourth adhesive layer 110 may be indirectly heated by irradiating the electrode layer 57 with the laser beam 104, thereby heating the electrode layer 57. As shown in FIG. 16, a black chromium layer 58 may be formed on the screen side surface, that is, on the viewer side surface of the electrode layer 57. An advantage of the black chromium layer 58 is that it improves the contrast of an image. Another advantage of the black chromium layer 58 is that since the energy absorptivity of the black chromium layer 58 is high, a portion of the fourth adhesive layer 110 can be effectively heated by a selectively irradiated laser beam 56.

Figure 17:
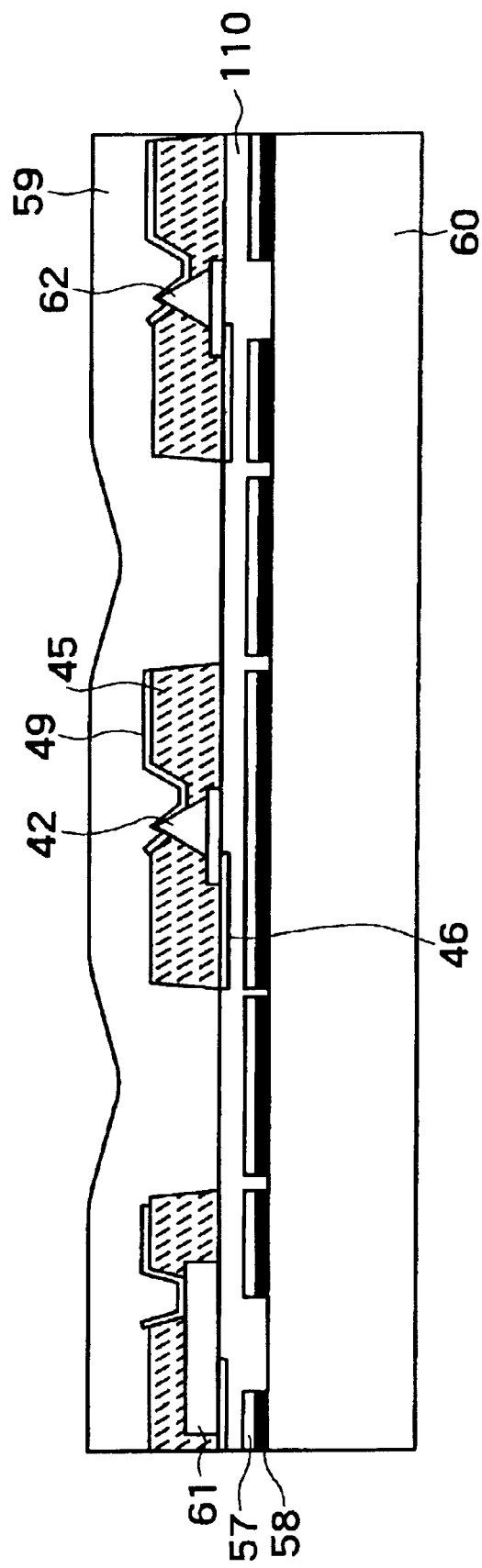
FIG. 17 is a schematic sectional view showing an insulating layer formation step subsequent to the step shown in FIG. 16.

FIG. 17 is a view showing a state in which light emitting diodes 42, 61, and 62 of three colors, RGB are arrayed on the second substrate 60 and are coated with an insulating layer 59. By mounting the light emitting diodes 42, 61, and 62 on the second substrate 60 at respective positions of the three colors by the above-described transfer method, a pixel composed of the light emitting diodes 42, 61 and 62 of the three colors can be formed with a fixed pixel pitch. The insulating layer 59 may be made from a transparent epoxy adhesive, UV-curing type adhesive, or polyimide. The shapes of the light emitting diodes 42, 61, and 62 of the three colors are not necessarily identical to each other. In the example shown in FIG. 17, the red light emitting diode 61, which has a structure having no hexagonal pyramid shaped GaN layer, is different in shape from each of the other light emitting diodes 42 and 62. However, in this stage, each of the light emitting diodes 42, 61, and 62 has already been covered with the adhesive layer 45 to be thus formed into a resin-covered chip, and therefore, the light emitting diodes 42, 61, and 62 can be handled in the same manner irrespective of the difference in device structure.

Figure 18:
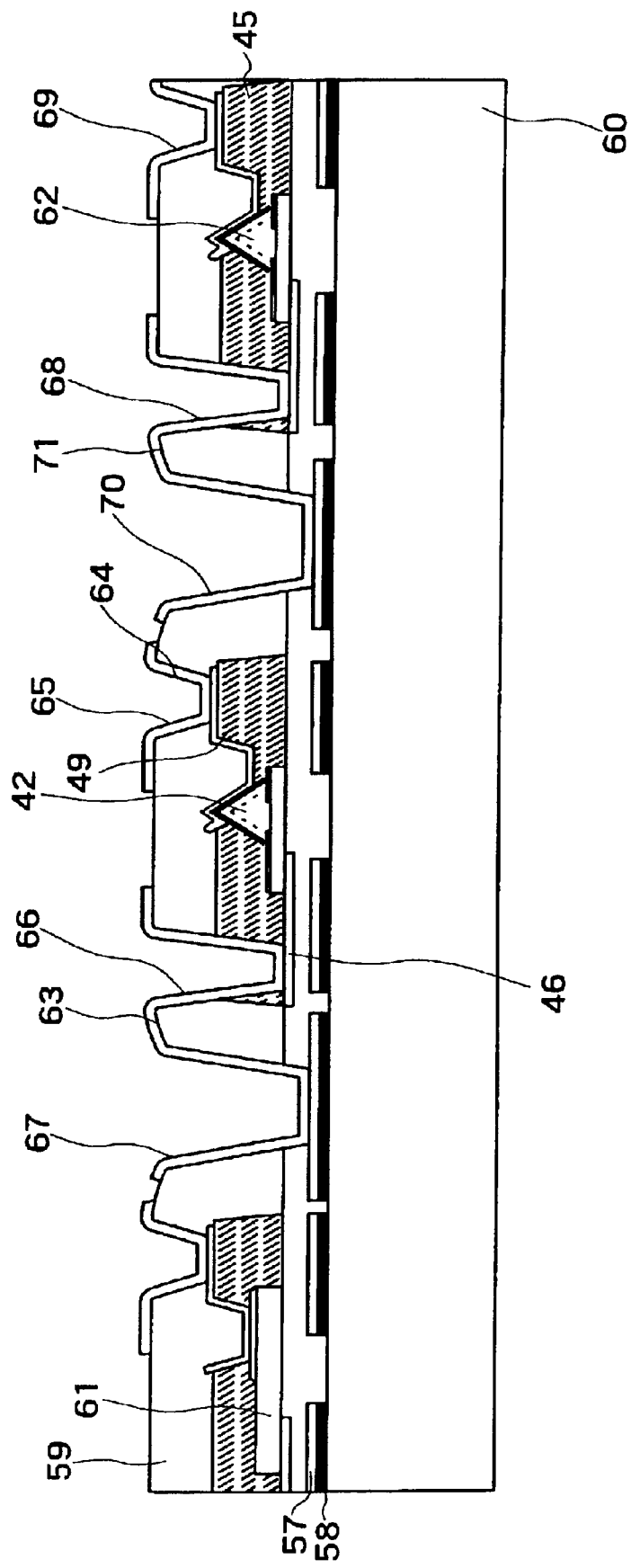
FIG. 18 is a schematic sectional view showing a wiring formation step subsequent to the step shown in FIG. 17.

FIG. 18 is a view showing a wiring step, in which opening portions 65, 66, 67, 68, 69, and 70 are formed in the insulating layer 59, and wiring portions 63, 64, and 71 for electrically connecting electrode pads for anode and cathode electrodes of each of the light emitting diodes 42, 61 and 62 to the electrode layer 57 for wiring on the second substrate 60 are formed in the opening portions 65, 66, 67, 68, 69, and 70. Since the areas of the electrode pads 46 and 49 of each of the light emitting diodes 42, 61, and 62 are large, the shapes of the opening portions, that is, via-holes 65, 66, 67, 68, 69 and 70 can be made large. As a result, the positioning accuracy of each via-hole may be made rough as compared with the case where a via-hole is directly formed in each light emitting diode. For example, for each of the electrode pads 46 and 49 having a size of about 60 m square, the via-hole having a diameter of about 20 m can be formed. The via-holes have three types having different depths: the first type is for connection to the second substrate (wiring substrate), the second type is for connection to the anode electrode, and the third type is for connection to the cathode electrode. The depth of each via-hole is optimized by controlling the pulse number of a laser beam depending on the type of the via-hole.

A protective layer is then formed on the wiring, to accomplish a panel of an image display unit. The protective layer may be made from the same transparent epoxy adhesive as that used for the insulating layer 59 shown in FIG. 18. The protective layer is heated to be cured, to perfectly cover the wiring. After that, a driver IC is connected from the wiring at the end portion of the panel, to produce a drive panel.

According to the method of arraying light emitting devices described above, since the light emitting diodes 42 have been held on the first temporarily holding member 43 in the state of being enlargedly spaced from each other, the relatively large electrode pads 46 and 49 can be provided on each of the diodes 42 by making use of the large distance for each of the adjacent diodes 42, and since the wiring is performed by making use of the relatively large electrode pads 46 and 49, even if the size of the final unit is significantly larger than the device size, the wiring can be easily formed.

Also, according to the method of arraying light emitting devices in this embodiment, since each light emitting diode 42 is covered with the flattened, cured adhesive layer 45, the electrode pads 46 and 49 can be accurately formed on the flattened front and back surfaces of the adhesive layer 45, and upon transfer of the light emitting diodes 42 from the first substrate 41 to the first temporarily holding member 43, the diodes 42 can be relatively simply peeled from the first substrate 41 and certainly transferred to the first temporarily holding member 43 by making use of decomposition of the GaN based material into gallium and nitrogen at the interface between GaN and sapphire.

Further, according to the method of arraying light emitting devices in this embodiment, upon transfer (second transfer step) of the resin-covered chips from the third temporarily holding member 101 to the second substrate 60, since the third temporarily holding member 101 has flexibility, only desired target resin-covered chips can be certainly and selectively transferred from the third temporarily holding member 101 to the second substrate 60.

Although the present invention has been described with reference to specific embodiments, those of skill in the art will recognize that changes may be made thereto without departing from the spirit and scope of the present invention as set forth in the hereafter appended claims.

What is claimed is:

1. A device arraying method of re-arraying a plurality of devices arrayed on a first substrate to a second substrate, the method comprising the steps of:

transferring and holding the devices to and on a first temporarily holding member such that the devices are spaced from each other with a pitch larger than an array pitch of the devices arrayed on the first substrate;

covering the devices held on the first temporarily holding member with a resin;

curing the resin;

dicing the resin to isolate the devices from each other; and transferring the resin-covered devices held on the first temporarily holding member to the second substrate such that the resin-covered devices are spaced from each other with a pitch larger than an array pitch of the resin-covered devices held on the first temporarily holding member, wherein the step of transferring the resin-covered devices includes the steps of selectively transferring part of the plurality of resin-covered devices held on the first temporarily holding member to a flexible third substrate including an adhesive layer, and transferring the part of the resin-covered devices, which have been transferred to the third substrate, to the second substrate including another adhesive layer.

2. An image display unit fabrication method of fabricating an image display unit including light emitting devices arrayed in a matrix, the method comprising the steps of:

transferring and holding the light emitting devices to and on a first temporarily holding member such that the light emitting devices are spaced from each other with a pitch larger than an array pitch of the light emitting devices arrayed on the first substrate;

covering the light emitting devices held on the temporarily holding member with a resin;

curing the resin;

dicing the resin to isolate the resin-covered light emitting devices from each other; and transferring the resin-covered light emitting devices held on the first temporarily holding member to a second substrate such that the resin-covered light emitting devices are spaced from each other with a pitch larger than an array pitch of the resin-covered light emitting devices held on the first temporarily holding member, wherein the step of transferring the resin-covered devices includes the steps of selectively transferring part of the plurality of resin-covered light emitting devices held on the first temporarily holding member to a flexible third substrate including an adhesive layer and transferring the part of the resin-covered light emitting devices, which have been transferred to the third substrate, to the second substrate including another adhesive layer.

* * * * *